United States Patent
Mihnea et al.

(10) Patent No.: US 7,885,091 B2
(45) Date of Patent: Feb. 8, 2011

(54) LIMITED CHARGE DELIVERY FOR PROGRAMMING NON-VOLATILE STORAGE ELEMENTS

(75) Inventors: Andrei Mihnea, San Jose, CA (US); Luca Fasoli, Campbell, CA (US)

(73) Assignee: SanDisk 3D LLC, Milpitas, CA (US)

( * ) Notice: Subject to any disclaimer, the term of this patent is extended or adjusted under 35 U.S.C. 154(b) by 71 days.

(21) Appl. No.: 12/472,074

(22) Filed: May 26, 2009

(65) Prior Publication Data
US 2010/0302835 A1    Dec. 2, 2010

(51) Int. Cl.
*G11C 11/00*    (2006.01)
(52) U.S. Cl. .................................. 365/148; 365/233.1
(58) Field of Classification Search .................. 365/148, 365/233.1
See application file for complete search history.

(56) References Cited

U.S. PATENT DOCUMENTS

| | | | |
|---|---|---|---|
| 4,511,811 A | 4/1985 | Gupta | |
| 5,912,839 A | 6/1999 | Ovshinsky et al. | |
| 5,933,365 A | 8/1999 | Klersy et al. | |
| 6,141,241 A | 10/2000 | Ovshinsky et al. | |
| 6,421,757 B1 | 7/2002 | Wang et al. | |
| 6,859,390 B2 | 2/2005 | Pashmakov | |
| 7,272,037 B2 | 9/2007 | Lee et al. | |
| 7,447,075 B2 | 11/2008 | Guterman et al. | |
| 7,453,730 B2 | 11/2008 | Guterman et al. | |
| 7,646,626 B2 * | 1/2010 | Parkinson et al. | 365/148 |

* cited by examiner

*Primary Examiner*—Huan Hoang
(74) *Attorney, Agent, or Firm*—Vierra Magen Marcus & DeNiro LLP

(57) ABSTRACT

A memory system includes a substrate, control circuitry on the substrate, a three dimensional memory array (above the substrate) that includes a plurality of memory cells with reversible resistance-switching elements, and a circuit for detecting the setting and resetting of the reversible resistance-switching elements. In one aspect a circuit that has one or more clock inputs is run for a predetermined number of clock cycles. The circuit generates an amount of charge over the predetermined number of clock cycles. At most the amount of charge is provided to non-volatile storage element to program the non-volatile storage element. It is determined whether the non-volatile storage element is programmed to a desired state as a result of providing at most the amount of charge to the non-volatile storage element. Techniques disclosed herein can be applied to program memory cells other than memory cells with reversible resistance-switching elements.

30 Claims, 13 Drawing Sheets

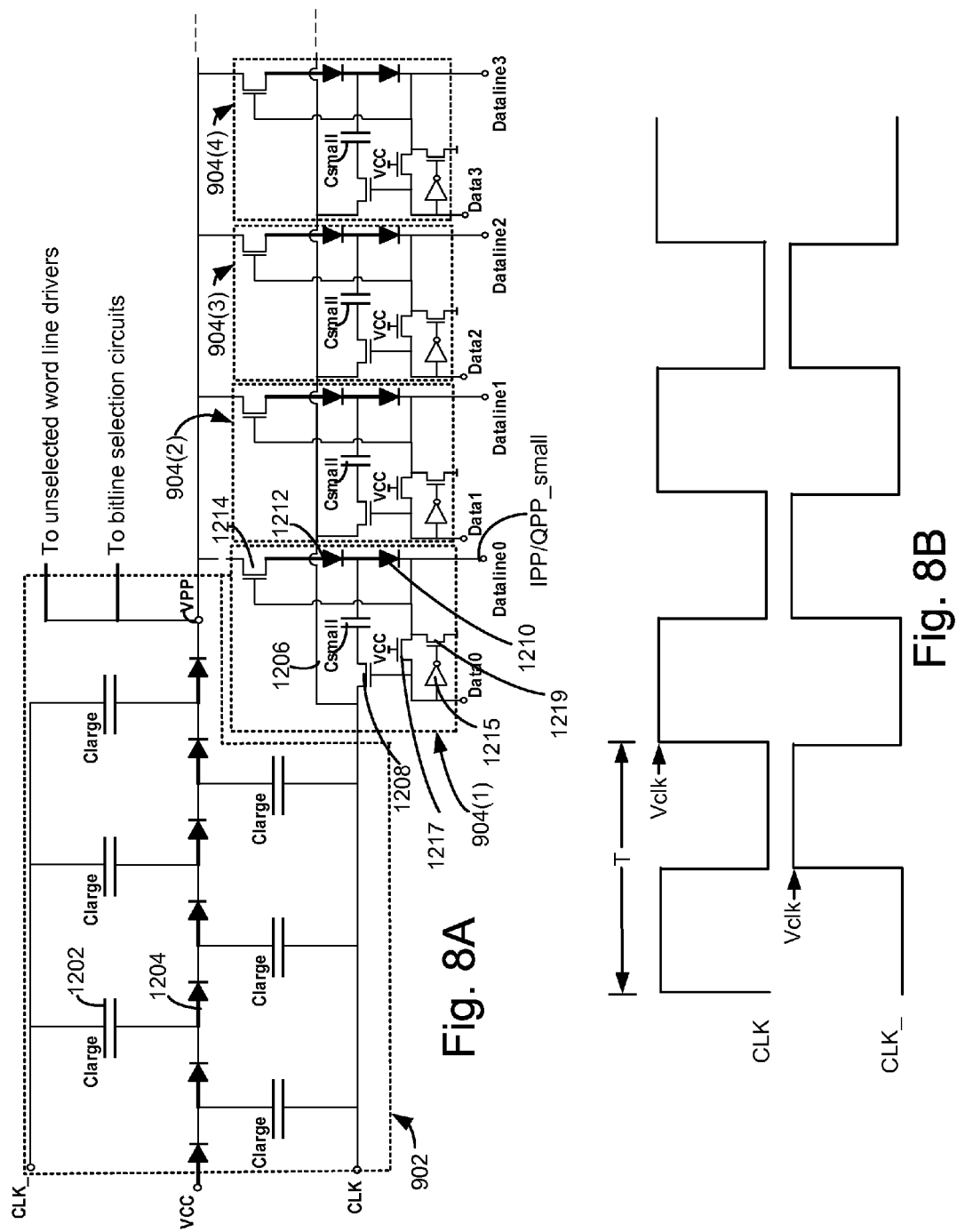

LIMITED CHARGE DELIVERY FOR PROGRAMMING NON-VOLATILE STORAGE ELEMENTS

BACKGROUND

1. Field

The present invention relates to technology for data storage.

2. Description of the Related Art

A variety of materials show reversible resistance-switching behavior. These materials include chalcogenides, carbon polymers, perovskites, and certain metal oxides and nitrides. Specifically, there are metal oxides and nitrides which include only one metal and exhibit reliable resistance switching behavior. This group includes, for example, NiO, $Nb_2O_5$, $TiO_2$, $HfO_2$, $Al_2O_3$, $MgO_x$ $CrO_2$, VO, BN, and AlN, as described by Pagnia and Sotnick in "Bistable Switching in Electroformed Metal-Insulator-Metal Device," Phys. Stat. Sol. (A) 108, 11-65 (1988). A layer of one of these materials may be formed in an initial state, for example a relatively low-resistance state. Upon application of sufficient voltage, the material switches to a stable high-resistance state. This resistance switching is reversible such that subsequent application of an appropriate current or voltage can serve to return the resistance-switching material to a stable low-resistance state. This conversion can be repeated many times. For some materials, the initial state is high-resistance rather than low-resistance.

These reversible resistance-switching materials are of interest for use in nonvolatile memory arrays. One resistance state may correspond to a data "0," for example, while the other resistance state corresponds to a data "1." Some of these materials may have more than two stable resistance states.

Non-volatile memories formed from reversible resistance-switching elements are known. For example, U.S. Patent Application Publication 2006/0250836, filed May 9, 2005 and titled "REWRITEABLE MEMORY CELL COMPRISING A DIODE AND A RESISTANCE-SWITCHING MATERIAL," which is hereby incorporated by reference herein in its entirety, describes a rewriteable non-volatile memory cell that includes a diode coupled in series with a reversible resistance-switching material such as a metal oxide or metal nitride.

However, operating memory devices that employ reversible resistance-switching materials is difficult. Specifically, programming can be difficult. Difficulties with programming non-volatile memory extends to materials other than reversible resistance-switching materials.

SUMMARY

Techniques are described for programming non-volatile storage. In some embodiments, circuits and methods are disclosed for controlling the setting and resetting of the resistance of reversible resistance-switching elements. One embodiment includes a substrate, control circuitry on the substrate, a three dimensional memory array (above the substrate) that includes a plurality of memory cells with reversible resistance-switching elements, and a circuit for setting and resetting of the reversible resistance-switching elements. The programming techniques described herein are not limited to reversible resistance-switching elements.

One embodiment of a non-volatile storage system includes a non-volatile storage element and a first circuit that generates charge in response to receiving a clock signal, and a second circuit that runs the first circuit for a predetermined number of clock cycles to generate an amount of charge. The second circuit provides at most the amount of charge to the non-volatile storage element to program the non-volatile storage element. The second circuit determines whether the non-volatile storage element has been programmed to a desired state as a result of providing at most the amount of charge to the non-volatile storage element.

One embodiment of a method of operating a non-volatile storage system includes the following steps. A circuit that has one or more clock inputs is run for a predetermined number of clock cycles. The circuit generates an amount of charge over the predetermined number of clock cycles. At most the amount of charge is provided to the non-volatile storage element to program the non-volatile storage element. It is determined whether the non-volatile storage element is programmed to a desired state as a result of providing at most the amount of charge to the non-volatile storage element.

One embodiment is a system comprising a memory array including groups of non-volatile storage elements, a charge pump associated with each group of non-volatile storage elements, and a managing circuit. The managing circuit runs the charge pumps for a predetermined number of clock cycles to generate an amount of energy from each of the charge pumps. The managing circuit provides no more than the amount of energy to a non-volatile storage element to be programmed from each group. The managing circuit determines whether each of the non-volatile storage elements to be programmed has been programmed to a desired state as a result of providing no more than the amount of energy.

BRIEF DESCRIPTION OF THE DRAWINGS

FIG. 8A depicts one embodiment of a charge pump that supplies a limited amount of charge or energy.

FIG. 8B depicts one embodiment of a clock signal that is input to a charge pump of FIG. 8A.

DETAILED DESCRIPTION

Figure 1:
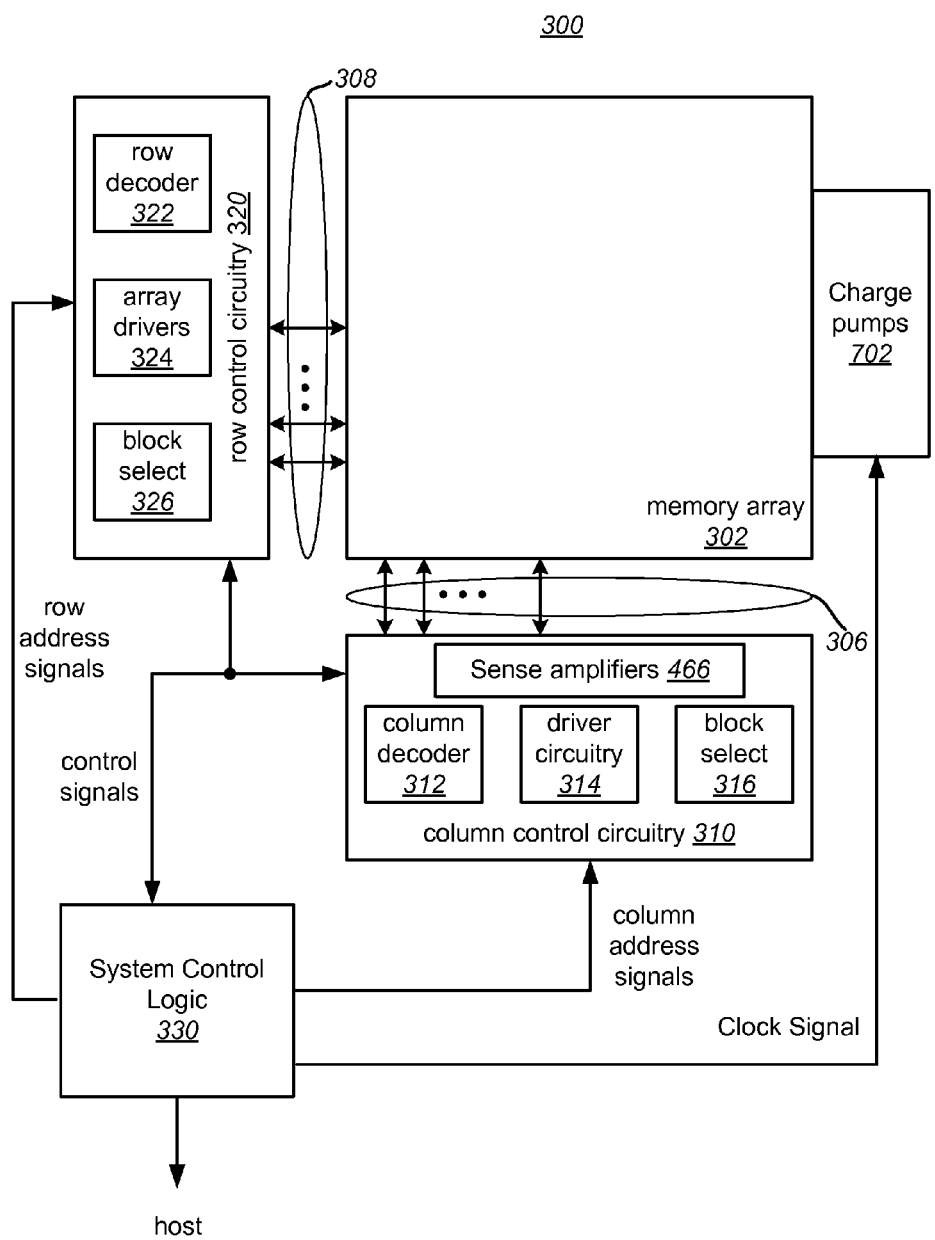
FIG. 1 is a block diagram of one embodiment of a memory system.

A memory system is provided that includes memory cells with a reversible resistivity-switching element. Various circuits and methods are disclosed for setting and resetting the resistance of the reversible resistance-switching elements. Techniques are disclosed for providing a limited amount of charge or energy to set and/or reset the reversible resistance-switching elements. However, techniques disclosed herein are not limited to setting and resetting the resistance of reversible resistance-switching elements. In one embodiment, non-volatile storage elements in a NOR memory array are programmed using a limited charge.

Reversible resistance-switching elements include materials having a resistivity that may be reversibly switched between two or more states. For example, the reversible resistivity-switching material may be in an initial high-resistivity state upon fabrication that is switchable to a low-resistivity state upon application of a first physical signal. For example, the device may switch states in response to application of a first amount of energy, charge, heat, voltage and/or current. Application of a second amount of energy, charge, heat, voltage and/or current may return the reversible resistivity-switching material to the high-resistivity state. Numerous reversible resistivity-switching materials and operation of memory cells employing reversible resistance-switching materials are described, for example, in U.S. Patent Application Publication 2006/0250836, previously incorporated.

In one embodiment, the process of switching the resistance from the high-resistivity state to the low-resistivity state is referred to as SETTING the reversible resistance-switching element. The process of switching the resistance from the low-resistivity state to the high-resistivity state is referred to as RESETTING the reversible resistance-switching element. The high-resistivity state may be associated with binary data "0" and the low-resistivity state is associated with binary data "1." In other embodiments, SETTING and RESETTING and/or the data encoding can be reversed.

In some embodiments, reversible resistance-switching material may be formed from a metal oxide. Various different metal oxides can be used. In one example, nickel oxide is be used. In some embodiments, a memory cell having a reversible resistance-switching material has a steering element, which can be a diode, or other suitable steering element that exhibits non-ohmic conduction by selectively limiting the voltage across and/or the current flow through the reversible resistance-switching element. In this manner, the memory cell may be used as part of a two or three dimensional memory array and data may be written to and/or read from the memory cell without affecting the state of other memory cells in the array. The diode may include any suitable diode such as a vertical polycrystalline p-n or p-i-n diode, whether upward pointing with an n-region above a p-region of the diode or downward pointing with a p-region above an n-region of the diode.

In some embodiments, the memory cells are arranged as a monolithic three dimensional array that includes multiple levels. In some embodiments, the memory levels may be formed as described in U.S. Pat. No. 6,952,030, "High-Density Three-Dimensional Memory Cell," which is hereby incorporated by reference herein in its entirety. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays. For example, the following patents provide examples of structures of memory cells that can be adapted to use reversible resistivity-switching material: U.S. Pat. No. 6,952,043; U.S. Pat. No. 6,951,780; U.S. Pat. No. 6,034,882; U.S. Pat. No. 6,420,215; U.S. Pat. No. 6,525,953; and U.S. Pat. No. 7,081,377. Techniques described herein are not limited to these example structures.

FIG. 1 is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. In one embodiment, the memory array 302 has a NOR flash configuration. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from System Control Logic circuit 330, and typically may include such circuits as row decoders 322, array terminal drivers 324, and block select circuitry 326 for both read and programming (e.g., SET and RESET) operations. Memory system 300 also includes column control circuitry 310 whose input/outputs 306 are connected to respective bit lines of the memory array 302. Column control circuitry 306 receives a group of N column address signals and one or more various control signals from System Control Logic 330, and typically may include such circuits as column decoders 312, array terminal receivers or drivers 314, block select circuitry 316, read circuitry (e.g., sense amplifiers 466), as well as write circuitry, and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300.

System control logic 330 controls charge pumps 702 that provide signals to program (e.g., SET and RESET) storage elements in the memory array 302. Specifically, the system control logic 330 provides a clock signal to the charge pumps 702. Charge pumps 702 may include many local charge pumps each of which is associated with a group of non-volatile storage elements. In some embodiments, there are enough local charge pumps such that one is available for each storage element that is being programmed at a particular time. In some embodiments, there is one local charge pump for each bit line in the memory array 302, although more or fewer could be used. The system control logic 330 precisely controls the local charge pumps in order to control the amount of charge that is available to each particular storage element during programming. Note that charge pumps 702 are depicted outside of the memory array 302, but in practice may be distributed within the memory array 302 to be close to the bit line for which each local charge pump is responsible.

The sense amplifiers 466 are configured to determine whether the storage elements have been programmed to a particular state. In some embodiments, there is one sense amplifier associated with each individual driver circuit 314, although more or fewer could be used. In some embodiments, there is one sense amplifier associated with each bit line in the memory array 302, although more or fewer could be used. In one embodiment, the sense amplifiers 466 determine whether a storage element is in a SET state or a RESET state. The system control logic 330 is connected to the sense amplifiers 466 in order to learn the state of the storage elements and take action based thereon. Note that sense amplifiers 466 are depicted outside of the memory array 302, but in practice may be distributed within the memory array 302 to be close to the bit line for which each sense amplifier is responsible.

In one embodiment, all of the components depicted in FIG. 1 are arranged on a single integrated circuit. For example, system control logic 330, column control circuitry 310, row control circuitry 320, sense amplifiers 466, and charge pumps 702 are formed on the surface of a substrate and memory array 302 is a monolithic three dimensional memory array formed above the substrate (and, therefore, above system control logic 330, column control circuitry 310 row control circuitry 320, sense amplifiers 466, and charge pumps 702). In some cases, a portion of the control circuitry, sense amplifiers 466 and/or charge pumps 702 can be formed on the same layers as some of the memory array 302.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

As described above, reversible resistance-switching element may be reversibly switched between two or more states. For example, the reversible resistivity-switching material may be in an initial, high-resistivity state upon fabrication that is switchable to a low-resistivity state upon application of a first amount of energy, charge, heat, voltage and/or current. Application of a second amount of energy, charge, heat, voltage and/or current may return the reversible resistivity-switching material to a high-resistivity state.

To determine which state the reversible resistance-switching element is in, a voltage is applied and the resulting current is measured. A higher measured current indicates that the reversible resistance-switching element is in the low-resistivity state. A lower measured current indicates that the reversible resistance-switching element is in the high-resistivity state.

Figure 2:
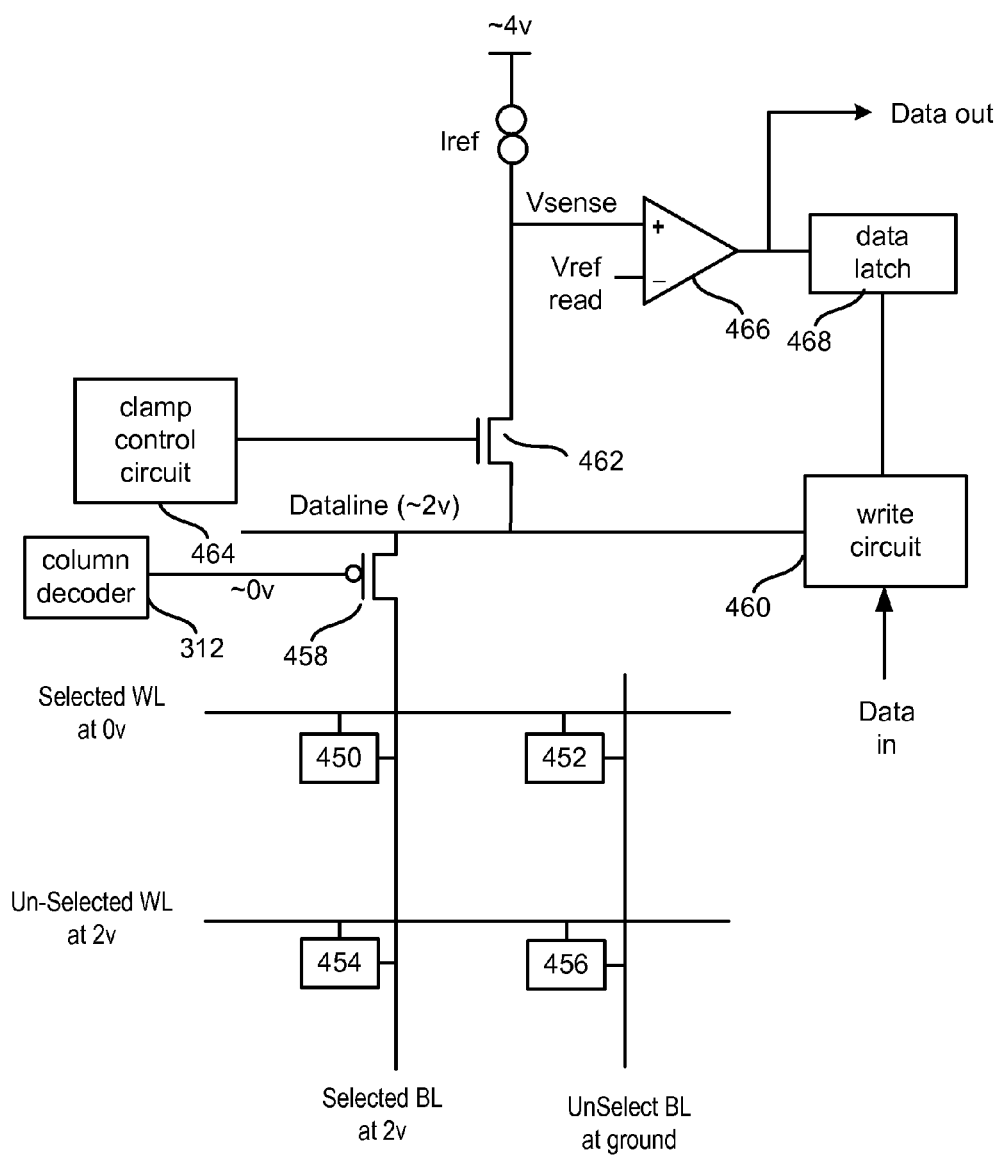
FIG. 2 depicts a circuit that can read the state of a memory cell.

FIG. 2 depicts a circuit that illustrates one embodiment for reading the state of a memory cell. It will be understood that embodiments of the present invention are not limited to the circuit of FIG. 2. FIG. 2 shows a portion of a memory array including memory cells 450, 452, 454 and 456. In some embodiments, each memory cell 450-456 includes a reversible resistance-switching element and a steering element, which may be a diode. Note that if a steering element is used it is not required that the steering element be a diode. Also note that it is not required that the memory cells 450-456 have a reversible resistance-switching element. Two of the many bit lines and two of the many word lines are depicted. Example materials for the bit lines and word lines include, but are not limited to, any suitable conductive material such as tungsten, any appropriate metal, heavily doped semiconductor material, a conductive silicide, a conductive silicide-germanide, a conductive germanide, or the like.

Figure 9A:
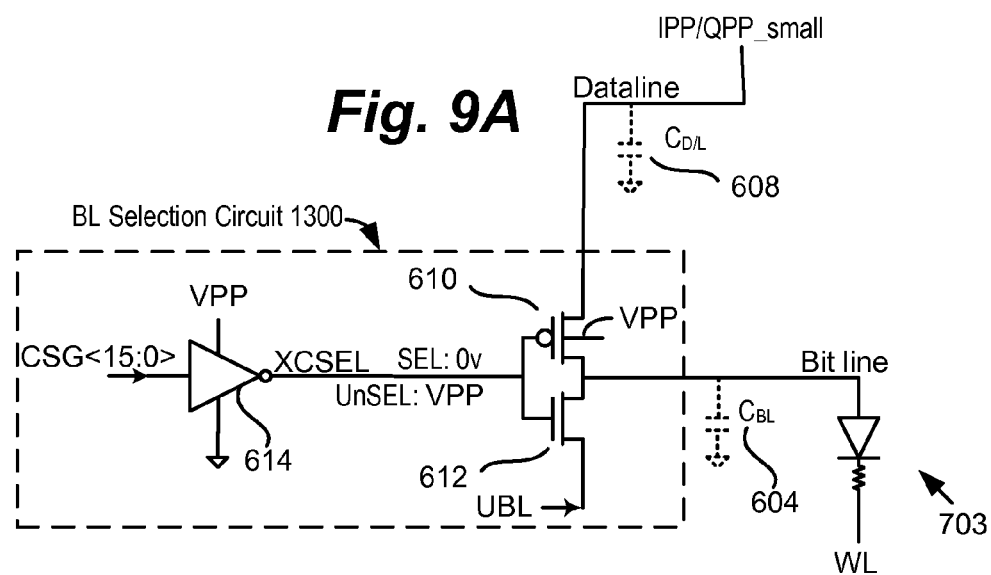
FIG. 9A depicts one embodiment of a schematic diagram of a bit line selection circuit.

A read circuit for one of the bit lines is depicted to be connected to the bit line via transistor 458, which is controlled by a gate voltage supplied by column decoder 312 in order to select or unselect the corresponding bit line. Transistor 458 connects the bit line to a Dataline. Note that transistor 458 is a simplification of the actual bit line selection circuitry. In one embodiment, a selected bit line is connected to the data line using a p-channel transistor and an unselected bit line is connected to ground (or some other voltage) using an n-channel transistor. However, it is not required that a p-channel transistor be used to connect the selected bit line to the data line, nor is it required that an n-channel transistor be used to connect the unselected bit line to ground (or some other voltage). Also, note that more than two transistors may be used. FIG. 9A depicts details of one embodiment of bit line selection circuitry that may connect a bitline to either a dataline or to some other voltage level. However, transistor 458 is not limited to the embodiment of FIG. 9A. Write circuit 460 (which is part of system control logic 330) is connected to the Dataline. Transistor 462 connects to the Dataline and operates as a clamp device that is controlled by clamp control circuit 464 (which is part of system control logic 330). Transistor 462 is also connected to comparator 466 and reference current supply Iref. The output of comparator 466 is connected to a data out terminal (to system control logic 330, a controller and/or a host) and to data latch 468. Write circuit 460 is also connected to data latch 468.

The following describes one example of reading reversible resistance-switching elements. Note that other techniques can be used to read such materials. Also note that embodiments of the present invention are not limited to memory cells formed from reversible resistance-switching elements. In some embodiments, the memory cells are formed from transistors. For example, the memory cells 450-456 may be part of a NOR flash memory array. When attempting to read the state of the reversible resistance-switching element, all word lines may first be biased at Vread (e.g., approximately 2 volts) and all bit lines may be at ground. The selected word line may then be pulled to ground. For example purposes, this discussion will assume that memory cell 450 is selected for reading. One or more selected bit lines are pulled to Vread through the dataline (by turning on transistor 458) and the clamp device (transistor 462, which receives ~2 volts+Vt). The clamp device's gate is above Vread but controlled to keep the bit line near Vread. Current is pulled by the selected memory cell through transistor 462 from the Vsense node. The Vsense node also receives a reference current Iref that is between a high-resistivity state current and a low-resistivity state current. The Vsense node moves corresponding to the current difference between the cell current and the reference current Iref. Comparator 466 generates a data out signal by comparing the Vsense voltage to a Vref-read voltage. If the memory cell current is larger than Iref, the memory cell is in the low-resistivity state and the voltage at Vsense will be lower than Vref. If the memory cell current is smaller than Iref, the memory cell is in the high-resistivity state and the voltage at Vsense will be higher than Vref. The data out signal from comparator 466 is latched in data latch 468.

As mentioned in the background section, programming reversible resistance-switching element presents special challenges. If conditions are not properly controlled during a SET operation, it is possible for the reversible resistance-switching element to SET and then immediately RESET. It may even be possible for the reversible resistance-switching element to oscillate between SET and RESET as a result of applying a programming signal such as a voltage to the memory cell over a period of time. Note that applying a certain programming voltage over a period of time may result in an uncontrolled amount of charge or energy being provided for programming. To prevent the SET and RESET and possibly other undesirable behavior, technology is proposed herein for limiting the amount of charge that is provided during a SET operation. In some embodiments, the amount of energy that is provided during a SET operation is limited.

It is also possible that during a RESET operation for the reversible resistance-switching element to RESET and then immediately SET. It may even be possible for the reversible resistance-switching element to oscillate between RESET and SET as a result of applying a programming signal such as a voltage to the memory cell over a period of time. To prevent the RESET and SET and possibly other undesirable behavior, technology is proposed herein for limiting the amount of charge that is provided during a RESET operation. In some embodiments, the amount of energy that is provided during a RESET operation is limited.

Figure 3:
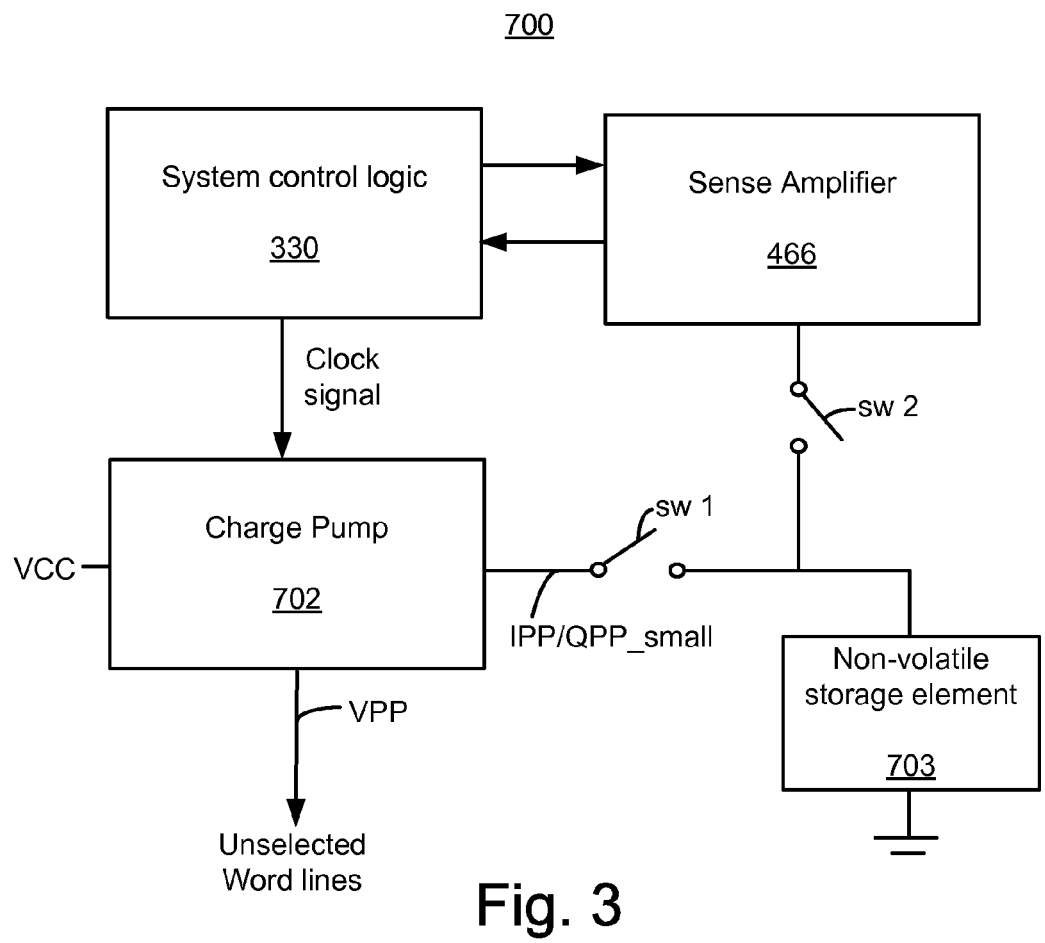
FIG. 3 depicts one embodiment of a circuit that supplies a limited amount of charge or energy to program a storage element.

FIG. 3 depicts one embodiment of a circuit 700 that limits the amount of charge that is available to a non-volatile storage element 703 during a programming operation. The non-volatile storage element 703 could be a reversible resistance-switching element; however, it is not so limited. In one embodiment, the non-volatile storage element 703 is part of a NOR memory array. For purposes of discussion, examples are provided herein in which the non-volatile storage element 703 is a reversible resistance-switching element. Thus, the circuit 700 is able to prevent a reversible resistance-switching element from undesirably switching from SET to RESET and back to SET during a RESET operation. Likewise, the circuit 700 is able to prevent a reversible resistance-switching element from undesirably switching from RESET to SET and back to RESET during a SET operation.

The charge pump 702 inputs a voltage "VCC" and one or more clock inputs and outputs signals "VPP" and "IPP/QPP_small." VCC refers to a power supply and could also be VDD, for example. In some embodiments, the voltage of IPP/QPP_small is approximately equal to the voltage of VPP. The current of IPP/QPP_small is a relatively small when compared to the current of VPP. IPP/QPP_small provides a well-controlled amount of electric current and charge to the non-volatile storage element 703 during programming. In one embodiment, IPP/QPP_small is provided to a reversible resistance-switching element during SET and RESET operations. The signal VPP may be supplied to unselected word lines and other circuitry. In some embodiments, VPP is provided to a selected word line. In some embodiments, VPP is provided to local charge pumps to help to generate IPP/QPP_small (See FIGS. 5A, 5B and 8A). Thus, VPP typically provides a large amount of charge, whereas IPP/QPP_small typically provides a small charge that is used for programming a single non-volatile storage element 703. In some embodiments, the charge pump 702 outputs –VPP in addition to, or instead of +VPP. For example, the charge pump 702 may include at least some circuits that act as a negative charge pump that outputs –VPP. Further details are discussed below.

In some embodiments, the circuit 700 does not require a voltage regulator to control the charge pump 702. Conventional techniques typically run a charge pump until a desired voltage (e.g., a program voltage or Vpp) is generated and then turn the charge pump clocks on and off to maintain Vpp at a constant level. However, the circuit 700 does not necessarily target any particular programming voltage when programming the non-volatile storage element 703. Instead, the system control logic 330 runs the charge pump 702 for a certain number of clock cycles to cause the charge pump 702 to generate IPP/QPP_small, which is used to program the storage element 703. In some embodiments, the charge associated with signal IPP/QPP_small (and also possibly VPP) depends on how many clock cycles the charge pump 702 is run. In some embodiments, a particular programming charge is targeted by running the charge pump clocks for a certain number of clock cycles. However, it is not required that the charge that is generated by the charge pump 702 be targeted to a particular amount of charge.

In some embodiments, as the charge pump 702 runs, the amount of electric energy that is output by the charge pump is incremented with each clock cycle. Therefore, charge pump 702 may deliver an amount of electric energy that is controlled by the number of clock cycles. Providing a limited amount electric energy may prevent the non-volatile storage element 703 from cycling between SET and RESET during a single programming cycle. For example, when setting a reversible resistance-switching element, the limited energy may prevent the non-volatile storage element 703 from going from RESET to SET and back to RESET in a single programming cycle. In some embodiments, a particular electric energy is targeted by running the charge pump clocks for a certain number of clock cycles. In some embodiments, as the charge pump 702 runs over several clock cycles, the amount of voltage that is output by the charge pump is incremented with each clock cycle. Note that charge, energy, and voltage, or at least two of these, are incremented with each clock cycle, in some embodiments.

The system control logic 330 is able to connect/disconnect the charge pump 702 to/from the storage element 703 to provide at most the generated charge (or energy) to nonvolatile storage element 703. Specifically, the system control logic 330 closes switch 1 to connect the charge pump 702 to the non-volatile storage element 703. Switch 1 may be implemented by one or more transistors that respond to various control signals from the system control logic 330. In one implementation, switch 1 is within bit line selection circuitry (see FIG. 9A). However, switch 1 could be within word line selection circuitry.

The sense amplifier 466 is capable of determining whether the non-volatile storage element 703 has been programmed to the desired state. The system control logic 330 opens and closes switch 2 to disconnect/connect the sense amplifier 466 from/to the non-volatile storage element 703. In one embodiment, switch 2 is implemented by one or more transistors that respond to various control signals. In one implementation, transistor 462 (FIG. 2) is used to implement switch 2.

Figure 4A:
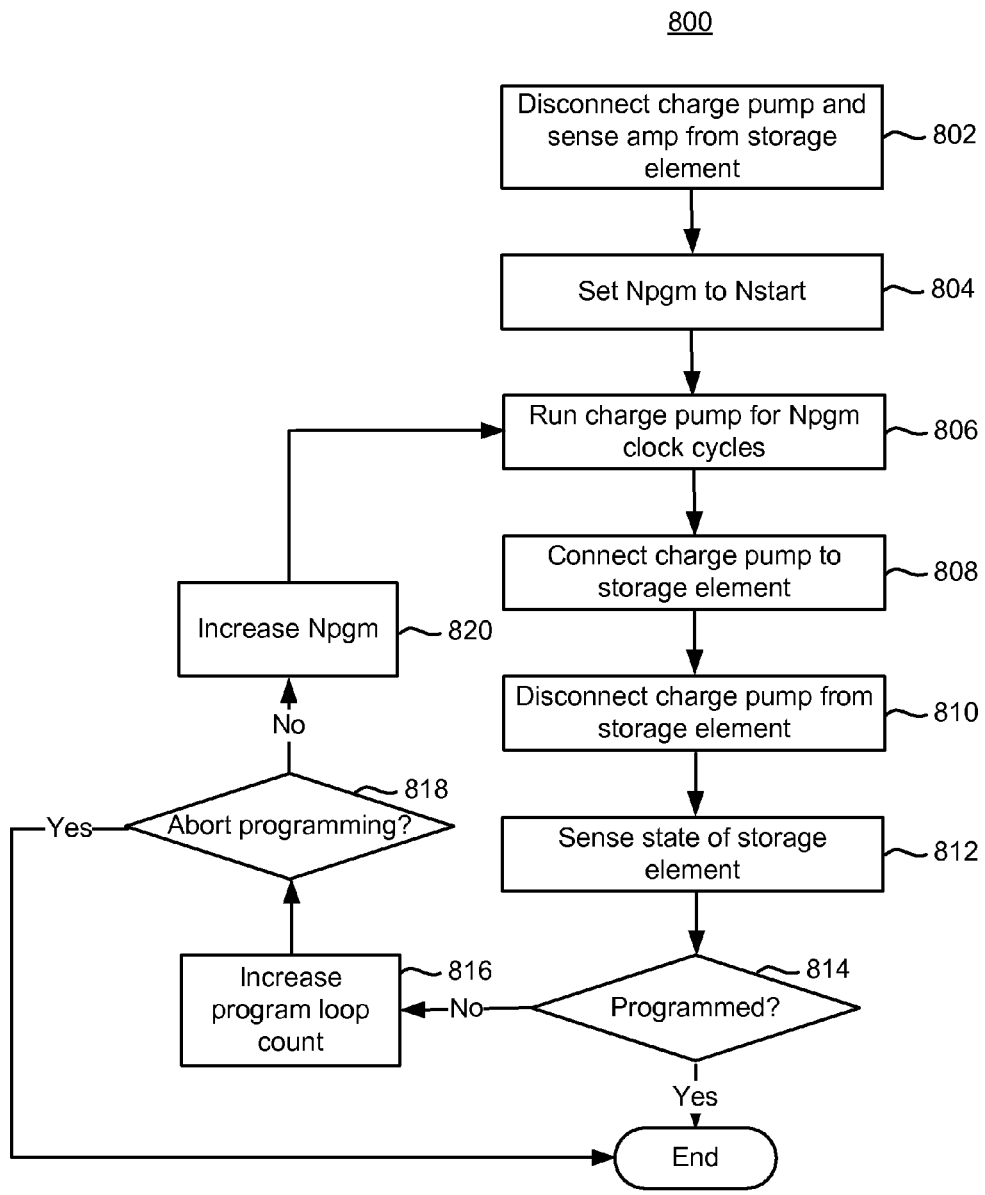
FIG. 4A depicts one embodiment of a process for providing a limited amount of charge or energy to program a storage element.

FIG. 4A is a flowchart illustrating one embodiment of a process 800 for programming non-volatile storage by providing a limited charge or energy. In one embodiment, process 800 is used to SET the non-volatile storage element 703. In one embodiment, process 800 is used to RESET the non-volatile storage element 703. Process 800 may also be used for non-volatile memory such as reversible-resistive memory elements, but is not so limited. Process 800 may be used when programming using circuit 700 of FIG. 3. In step 802, the charge pump 702 and sense amplifier 466 are disconnected from the non-volatile storage element 703. For example, the system control logic 330 opens switch 1 and switch 2.

In step 804, the system control logic 330 establishes the number of clock cycles ("Npgm") for which the charge pump 702 will be run to an initial value. The number of clock cycles should be low enough such that the amount of charge or energy that is generated and made available to the storage element 703 will not cause the storage element 703 to switch from one state to another and back.

In step 806, the system control logic 330 runs the charge pump 702 for Npgm clock cycles. In one embodiment, the system control logic 330 provides a clock signal to the charge pump 702. However, another technique could be used to run the charge pump 702 for a certain number of clock cycles, such as providing an enable/disable signal that causes the charge pump 702 to run or stop running. In one embodiment, the charge is built up and stored on an output capacitor of the charge pump 702 while the charge pump 702 is run.

In step 808, the system control logic 330 connects the charge pump 702 to the non-volatile storage element 703. For example, the system control logic 330 closes switch 1 to connect the charge pump 702 to the non-volatile storage element 703. Thus, the charge (or energy) that is available to program the storage element 703 is limited to at most the amount of charge (or energy) that was generated from running the charge pump 702 for the predetermined number of clock cycles. Because there are typically other circuitry and signal lines between the output of the charge pump 702 and the non-volatile storage element 703, some of the generated charge (or energy) may not be available for programming the non-volatile storage element 703. In one embodiment, the charge pump 702 is connected to a selected bit line in step 808 to provide the limited amount of charge. In one embodiment, the charge pump 702 is connected to a selected word line in step 808 to provide the limited amount of charge.

In process 800, the charge pump 702 is connected to the non-volatile storage element 703 after the amount of charge has been generated (e.g., after the clock has been shut off). In such embodiments, the charge from the charge pump 702 may be stored on a capacitor prior to the start of programming the non-volatile storage element 703. For example, the charge is stored on an output capacitor of the charge pump 702 prior to closing switch 1. Because the energy on the capacitor is given by the following equation, this implies that a limited amount of energy is available to program the non-volatile storage element 703.

$$Energy = \tfrac{1}{2} C V^2$$

In step 810, the system control logic 330 disconnects the charge pump 702 from the non-volatile storage element 703. For example, the system control logic 330 opens switch 1. In step 812, the sense amplifier 466 senses the state of the non-volatile storage element 703. In one embodiment, the circuit of FIG. 2 is used to determine that state. The system control logic 330 obtains this state information and determines whether the storage element 703 has been programmed to the desired state (step 814). Referring to FIG. 2, the system control logic 330 obtains "data out" from the sense amplifier 466.

If the storage element 703 has been programmed to the desired state, then process 800 ends. Otherwise, the system control logic 330 increments a program loop count by one in step 816 (that is, the number of iterations of process 800). In step 818, a determination is made whether too many program iterations have occurred. If the program loop count is too high (step 818), then programming is aborted. If the count is within an acceptable amount, then the number of clock cycles to be applied to the charge pump (Npgm) is incremented in step 820. In one embodiment, the system control logic 330 increments Npgm by one each iteration of process 800. The increment is not required to be the same each iteration. It will be understood that it is not required that the system control logic 330 increment Npgm with each iteration, or even with any iteration. Control then passes to step 806 in which the charge pump 702 is run for Npgm number of clock cycles.

Figure 4B:
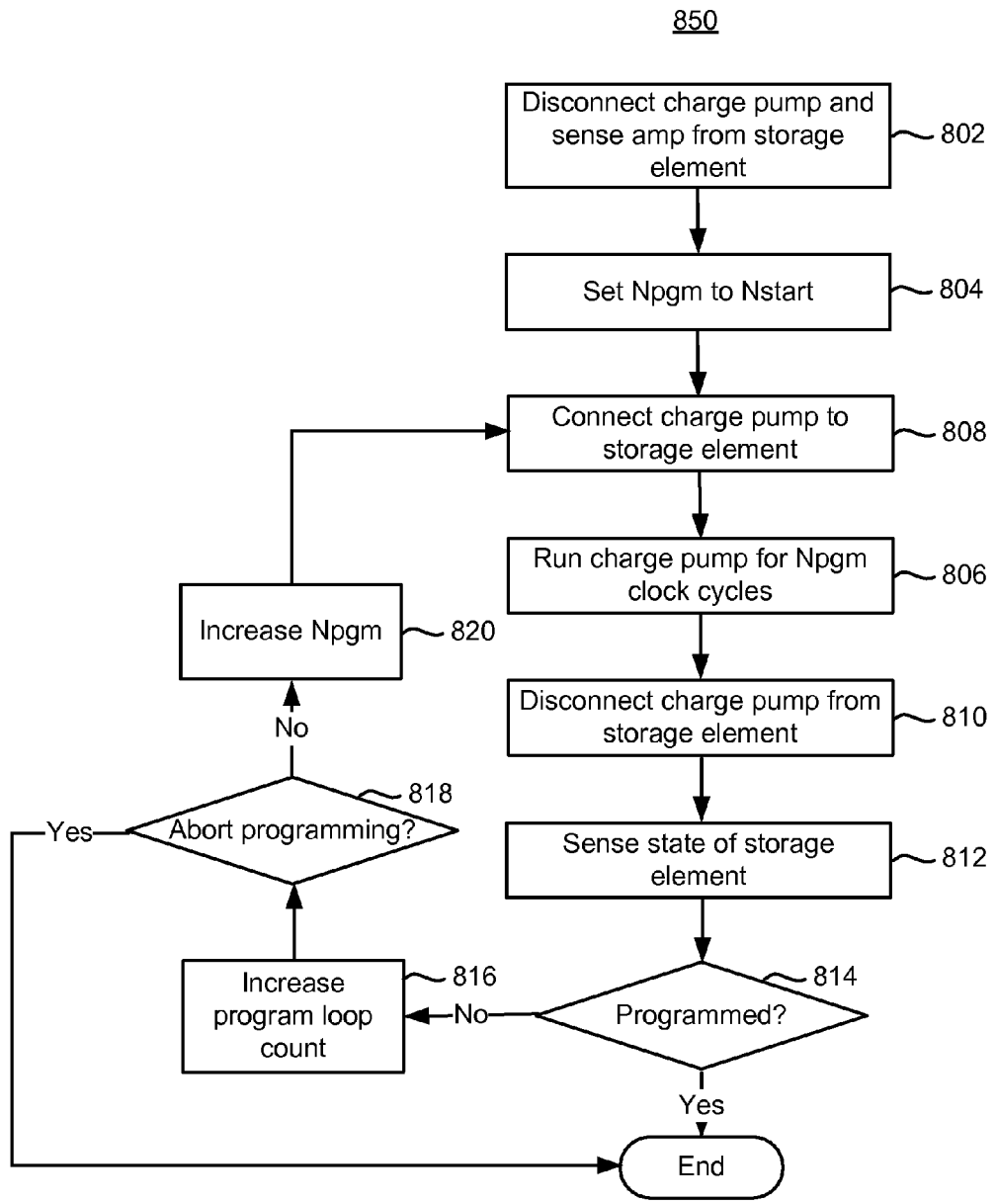
FIG. 4B depicts one embodiment of a process for providing a limited amount of charge or energy to program a storage element.

In process 800, the charge pump is run for Npgm clock cycles in step 806 prior to connecting the charge pump 702 to the non-volatile storage element 703 in step 808. However, the charge pump 702 may be connected to the non-volatile storage element 703 prior to running the charge pump 702. FIG. 4B is a flowchart illustrating one embodiment of a process 850 for programming non-volatile storage by providing a limited charge or energy. Process 850 is similar to process 800, but the charge pump 702 is connected to the storage element 703 while the charge pump 702 runs to generate the charge or energy. Thus, steps 806 and 808 are reversed.

In one embodiment, when RESETTING a reversible resistive storage element, process 800 is used. Thus, the charge pump 702 is run for Npgm clock cycles prior to connecting the charge pump 702 to the reversible resistive storage element when RESETTING. In one embodiment, either process 800 or 850 may be used when SETTING a reversible resistive storage element.

Figure 5A:
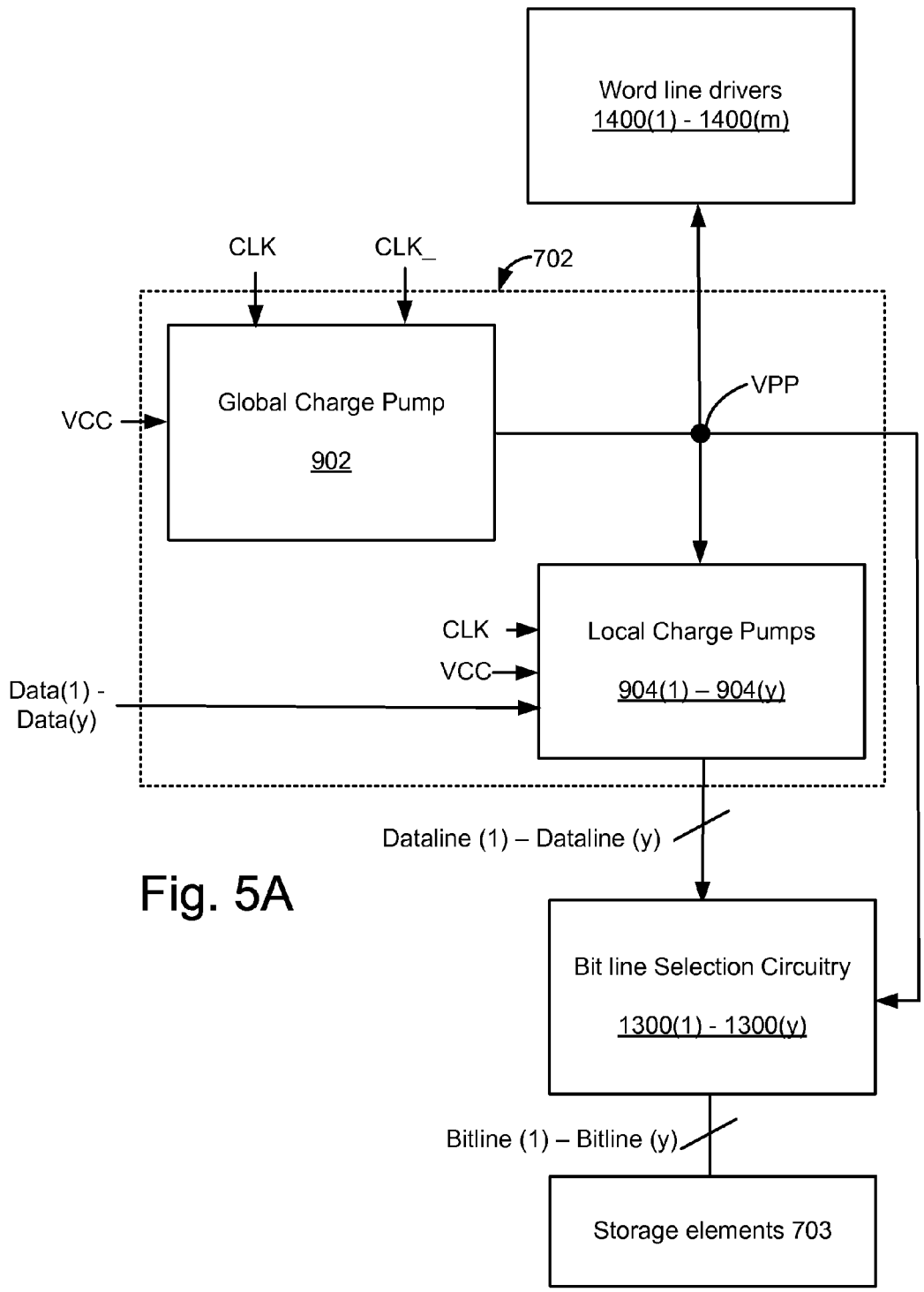
FIG. 5A depicts a block diagram of one embodiment of a charge pump that supplies a limited amount of charge or energy to a bit line selection circuit and word line drivers.

FIG. 5A depicts a block diagram of one embodiment of a charge pump 702 that outputs programming signals to a bit line selection circuit and word line drivers. The charge pump 702 is one implementation of the charge pump 702 of FIG. 3. The charge pump 702 is divided into a global charge pump 902 that outputs VPP and many local charge pumps 904(1)-904(y) that each output IPP/QPP_small. There may be hundreds or thousands of local charge pumps 904(1)-904(y). In one embodiment, it is IPP/QPP_small that is supplied to the memory cells 703 during programming (e.g., SET and RESET operations). In this embodiment, IPP/QPP_small(1)-IPP/QPP_small(y) are provided on dataline(1)-dataline(y) to bit line selection circuitry 1300(1)-1300(y). The bit line selection circuitry 1300 is used to select bit lines that have a storage element 703 that is to be programmed. There may be one bit line selection circuit 1300 for each bit line or a set of bit line selection circuits that can be switchably connected to different subsets of bit lines. VPP may be supplied to word line drivers 1400(1)-1400(m). In one embodiment, VPP is provided to unselected word lines when programming a storage element on a selected word line.

The global charge pump 902 inputs a clock signal CLK and its complement CLK_, as well as VCC. Note that VCC could be VDD or some other power supply. The global charge pump 902 supplies VPP to the local charge pumps 904(1)-904(y). The global charge pump 902 also provides VPP to word line drivers 1400(1)-1400(m). In some embodiments, word line drivers 1400 provide VPP to unselected word lines. Note that VPP may be provided to other circuitry, including circuit elements in the bit line selection circuits 1300. The local charge pumps 904(1)-904(y) input Data(1)-Data(y), as control signals. Data(1)-Data(y) are the data to be programmed into a storage element 703 associated with each particular local charge pumps 904(1)-904(y).

Figure 7:
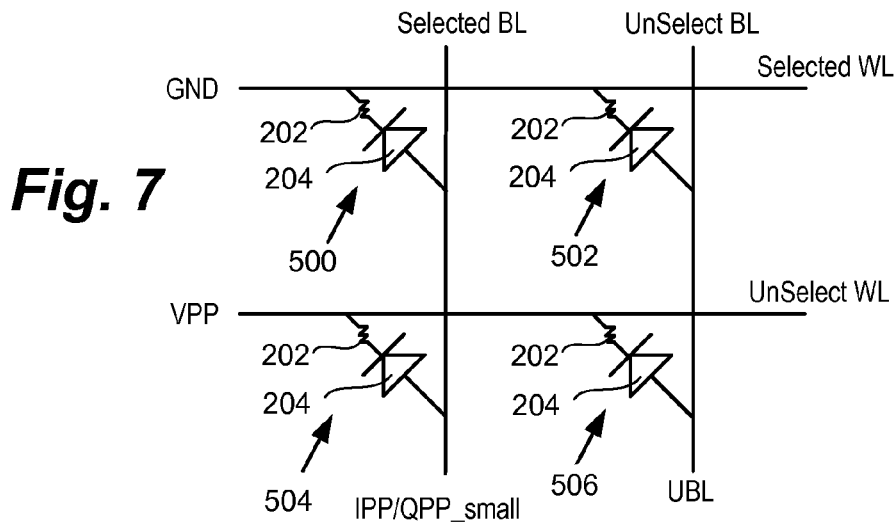
FIG. 7 depicts a schematic diagram of one embodiment of signals applied to word lines and bit lines when programming a non-volatile storage element.

FIG. 7 is one embodiment of a schematic diagram showing signals that are supplied to bit lines and word lines during programming (e.g., SET and RESET operations). The scheme of FIG. 7 is suitable when using a charge pump 702 that outputs IPP/QPP_small and VPP such as charge pumps described herein. However, note that other circuitry could be used to generate the charges. FIG. 7 shows four memory cells 500, 502, 504 and 506. In this embodiment, each memory cell 500-506 includes a reversible resistance-switching element 202 and a steering element 204, which may be a diode. Note that if a steering element 204 is used it is not required that the steering element 204 be a diode. Also note that it is not required that the memory cells 500-506 have a reversible resistance-switching element 202. In some embodiments, the memory cells are formed from transistors. For example, the memory cells may be part of a NOR flash memory array. In a full memory array, there would be many more than four memory cells.

In this embodiment, the same signals are applied during SET and RESET; however, this is not a requirement. In the scheme depicted in FIG. 7, the selected word line is grounded, IPP/QPP_small is supplied to the selected bit line, VPP is supplied to unselected word lines, and unselected bit lines are connected to UBL, which refer to "unselected bit line" voltage. The UBL may be a suitable low voltage between 0V and about the forward bias voltage for diode 204 (or somewhat below the forward bias voltage). For example, diode 204 may be a polysilicon diode with a forward bias voltage of about 0.9V. In some embodiments, UBL is about 0.7V.

Memory cell 500 is selected for the SET or RESET operation. Therefore, IPP/QPP_small is applied at the selected bit line and the selected word line is grounded. Thus, IPP/QPP_small is applied across the selected storage element 500 and its steering element 204 (e.g., diode). In this example, the diode is forward biased during SET and RESET operations. However, forward biasing is not an absolute requirement. As previously discussed, VPP and IPP/QPP_small are not required to be targeted to any specific voltage. However, in this embodiment, providing IPP/QPP_small results in sufficient voltage build up on the selected bit line to both forward bias the diode and to SET or RESET the memory cell 500. As previously discussed, the amount of charge (or energy) providing by IPP/QPP_small may need to be increased by running the charge pump 702 for a greater number of clock cycles and re-applying IPP/QPP_small.

Unselected memory cell 504 has IPP/QPP_small applied at the selected bit line and VPP supplied at the unselected word line. As previously discussed, VPP and IPP/QPP_small are not targeted to any specific voltage. However, applying VPP to the unselected word line causes voltage to build up on the unselected word line. The unselected word line voltage should be high enough to prevent memory cell 504 from SETTING or RESETTING. In some embodiments, the unselected word line voltage is at least as great as the selected bit line voltage, thus assuring that the diode in memory cell 504 is not forward biased. However, a small forward bias current will not necessarily result in SETTING or RESETTING memory cell 504. Any possible reverse bias current should not be sufficient to SET or RESET the memory cell 504.

Unselected memory cell 502 has its unselected word line grounded. The unselected bit line is connected to UBL. Therefore, the memory cell 502 should not conduct current and, therefore, should not SET or RESET. In some embodiments, the unselected bit line is at about 0.7 V above ground. However, this should not cause memory cell 502 to SET or RESET at least due to the voltage needed to forward bias the diode.

Unselected memory cell 506 has its unselected bit line connected to UBL and VPP supplied to the unselected word line. The unselected word line voltage due to VPP should be greater than or equal to UBL volts, thus the diode in the memory cell 506 is not forward biased. Any possible reverse bias current should not be sufficient to SET or RESET memory cell 506. In some embodiments, the unselected bit line is at about 0.7 V above ground. However, this should not cause memory cell 506 to SET or RESET because VPP at the unselected word line should keep the diode from becoming forward biased and any possible reverse bias current should not be sufficient to SET or RESET memory cell 506.

In the example of FIG. 7 because the steering element 204 is a diode, the switching is unipolar. However, the steering element 204 is not required to be a diode. Specifically, the steering element 204 could have symmetrical bi-directional non-linear conduction. In this case, the limited charge might be supplied to the selected bit line for a SET operation; however, the limited charge might be supplied to the selected word line for a RESET operation. When providing a limited charge to a selected word line, a negative charge may be provided by a negative charge pump as further described below. Also, the limited charge might be supplied to the selected bit line for a RESET operation, but to the selected word line for a SET operation. Of course, the limited charge could also be supplied to the selected bit line for both SET and RESET or selected word line for both SET and RESET when using a bi-directional steering element. As previously mentioned, embodiments are not limited to memory cells with steering elements. Thus, neither a bi-directional steering element nor a uni-directional steering element is required.

Figure 5B:
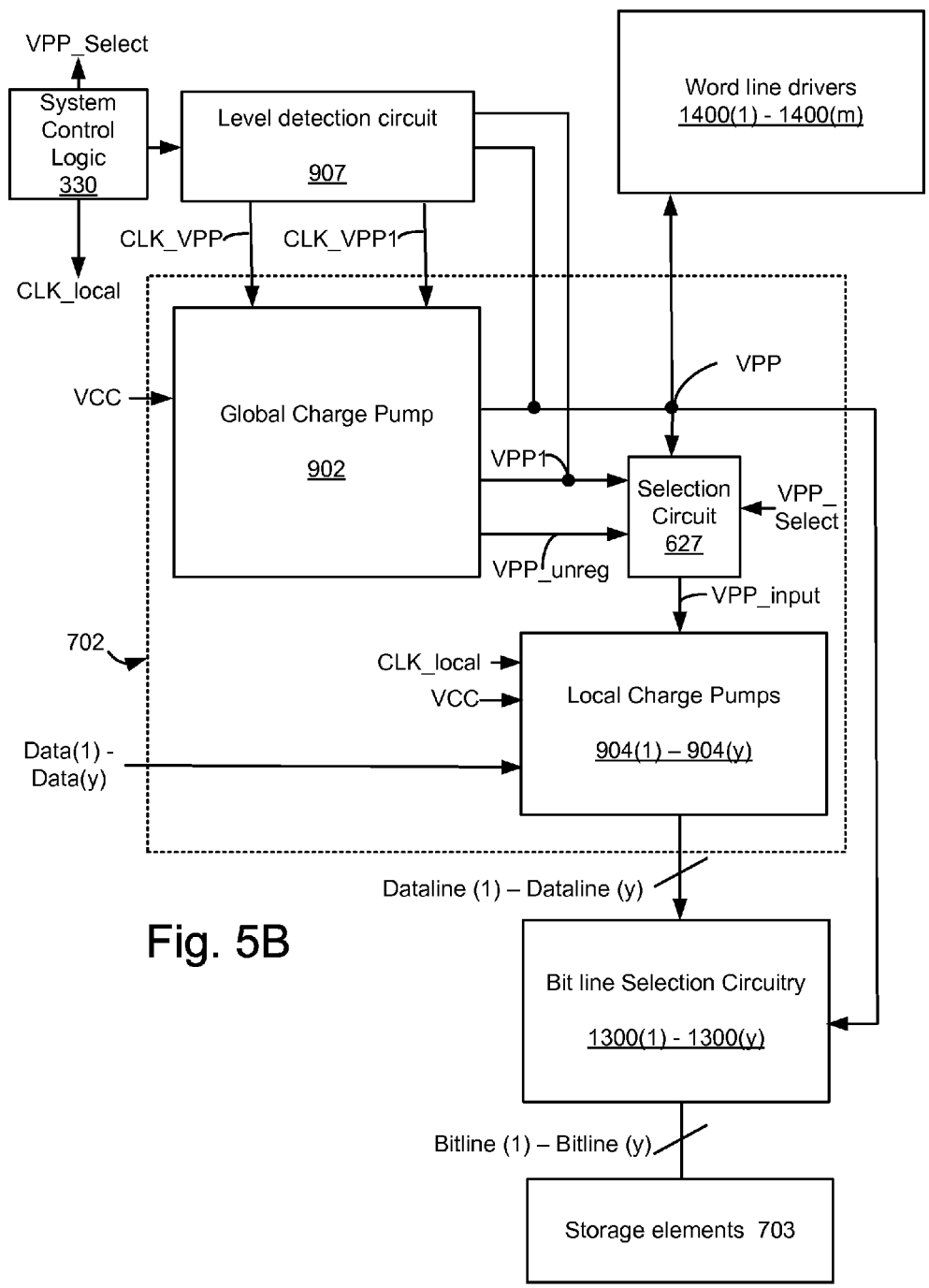
FIG. 5B depicts a block diagram of one embodiment of a charge pump having a global charge pump with a regulated output and local charge pumps.

FIG. 5B depicts one embodiment of a charge pump 702 and is one implementation of the charge pump 702 of FIG. 3. In general, charge pump 702 includes a global charge pump 902 and local charge pumps 904(1)-904(y). The local charge pumps 904 are similar to those of the embodiment of FIG. 5A and will not be discussed in detail. In practice, there may be hundreds or thousands of local charge pumps 904. The local charge pumps 904(1)-904(y) input Data(1)-Data(y), as control signals. Data(1)-Data(y) are the data to be programmed into a storage element associated with each particular local charge pumps 904(1)-904(y). The charge pump 702 of FIG. 5B may be used to both SET and RESET storage elements 703.

Figure 9B:
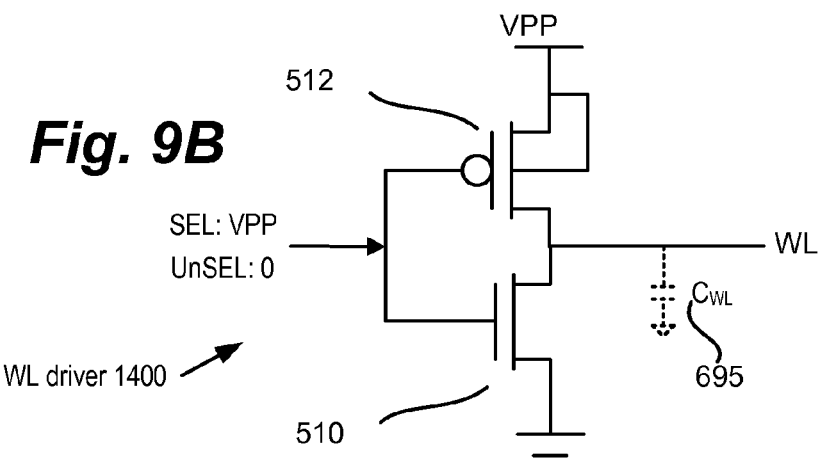
FIG. 9B depicts one embodiment of a schematic diagram of a word line driver.

As with the circuit of FIG. 5A, the global charge pump generates VPP, which is provided to the word line drivers 1400(1)-1400(m) and to the bit line selection circuitry 1300(1)-1300(m). Further details of providing VPP to bit line selection circuitry is depicted in FIG. 9A. Further details of providing VPP to a word line driver is depicted in FIG. 9B. Also note that VPP may be provided to an unselected word line as discussed with respect to FIG. 7. Note that VPP may be provided to other circuitry, including circuit elements in the bit line selection circuits 1300.

In this embodiment, the global charge pump 902 is not run for a predetermined number of clock cycles to generate VPP. Rather, the global charge pump 904 is controlled by level detection circuit 907 in order to generate VPP. The level detection circuit 907 also controls the global charge pump 904 to generate VPP1. In some embodiments, level detection circuit 907 is a voltage regulator. The global charge pump 902 and local charge pumps 904 are controlled by different clocks. The level detection circuit 907 samples the global charge pump output (VPP) and controls CLK_VPP to regulate VPP. The level detection circuit 907 samples the global charge pump output (VPP1) and controls CLK_VPP1 to regulate VPP1. The clock to the local charge pumps 904 (CLK_local) is under control of system control logic 330. For example, a state machine in the system control logic 330 controls CLK_local.

The global charge pump 904 may also provide an unregulated voltage, VPP_unreg, which has a magnitude less than VPP in some embodiments. In one embodiment, VPP_unreg is a power supply voltage such as VDD. Note that VPP_unreg can be provided by an element other than the global charge pump 902. The input voltage to the local charge pumps, VPP_input, may be any of VPP, VPP1, or VPP_unreg. In one embodiment, the system control logic 330 provides control signal VPP select to selection circuit 627 to select which voltage is input to the local charge pumps 904. In some embodiments, selection circuit 627 is part of the global charge pump 902. The system control logic 330 may provide a control signal to the level detection circuit 907 to specify what the magnitude of VPP should be. The system control logic 330 may also provide a control signal to the level detection circuit 907 to specify what the magnitude of VPP1 should be. In some embodiments, the present value of VPP1 has a magnitude that is less than the present value of VPP for reasons that are discussed below. Note that it is not required that VPP_unreg be used. Also, it is not required that the magnitude of VPP1 be adjustable. In some embodiments, the magnitude of VPP is adjustable, but VPP1 may or may not be adjustable.

Whether VPP, VPP1, or VPP_unreg is input to the local charge pumps 904 may depend on the maximum dataline voltage that is expected to occur as a result of running the local charge pumps 904 for the predetermined number of cycles. Moreover, the target value for VPP and/or VPP1 that is provided from control logic 330 to level detection 907 may depend on the maximum expected dataline voltage. In one embodiment, the determination of what voltage to provide the local charge pumps 904 is made based on the predetermined number of clock cycles for which the local charge pump will be run. For example, the input voltage for local charge pumps 904 can be VPP if Vdataline(peak max)<VPP+Vdiode, where Vdataline (peak max) refers to the maximum bitline voltage generated by any local charge pump 904, VPP is the global charge pump output that is provided to unselected word lines (and other circuit elements), and Vdiode is the turn-on voltage for a diode in a memory cell. However, if the output of the local charge pumps 904 could go higher than VPP+Vdiode, then the input voltage to the local charge pumps 904 should be generated from a lower voltage than the present value of VPP. For example, either VPP1 or VPP_unreg may be used (where these voltages are less than the present value VPP). Note that by present value it is meant the target voltage to which the level detection circuit 907 is regulating the global charge pump output.

A reason for using the lower input voltage can be understood with reference to FIG. 7, in which VPP is provided to unselected word lines and IPP/QPP_small is provided to selected bit lines. Note that in FIG. 7, IPP/QPP_small is stated as being at VPP. However, if the voltage on the bit line gets too high, then it is possible to forward bias a diode of an unselected storage element. For example, the diode 204 in storage element 504 could undesirably become forward biased if the selected bit line voltage goes above VPP+Vdiode. Therefore, if the above inequality holds true (e.g., when running the local charge pumps 904 for a relatively low number of clock cycles), then conductive storage elements on unselected word lines will not turn on during a program step on a selected word line. However, if the inequality were not true for a given local charge pump input voltage, then a lower input voltage should be provided to the local charge pumps 904 to avoid turning on conductive storage elements on unselected word lines. As a specific example, the inequality might not hold true if VPP were to be used as a local charge pump input and the local charge pumps were run for a high number of clock cycles. Stated another way, the voltage applied to the selected bit line might be too high. In such a case, a lower local charge pump input voltage should be used (relative to the voltage applied to the unselected word lines) so that the inequality does hold true.

Figure 6:
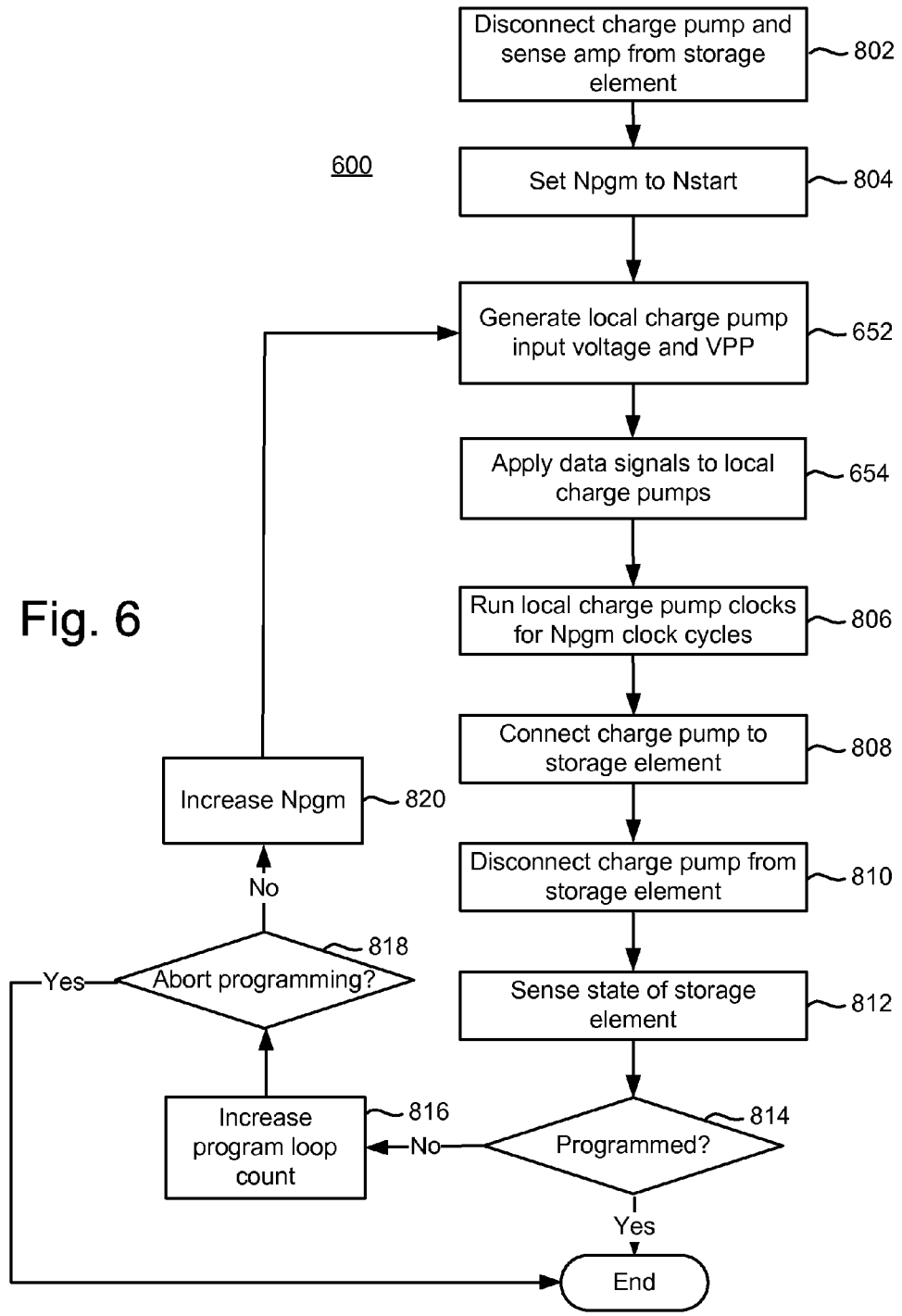
FIG. 6 is one embodiment of a process of operating the charge pump of FIG. 5B.

FIG. 6 is a flowchart depicting one embodiment of a process 600 of operating the circuit of FIG. 5B. For convenience of explanation, using a single local charge pump 904 to program a single storage element 703 is described. However, process 600 may be used to program many storage elements in parallel using many local charge pumps 904. Note that some steps of process 600 are similar to steps in process 800 of FIG. 8A and hence use the same reference numerals. In step 802, the local charge pump 904 and sense amplifier (FIG. 2, 466) is disconnected from the storage element 703. In step 804, the number of clock cycles ("Npgm") for which the local charge pump 904 is to be run is set to an initial value "Nstart." In step 652, a local charge pump power supply voltage ("input voltage") and VPP are generated. As previously discussed, the input voltage to the local charge pump 904 may or may not be the same as VPP. The magnitude for input voltage may be selected based on the number of clock cycles for which the local charge pump 904 is to be run. For example, if the local charge pump 904 is to be run for a relatively few clock cycles, then the input voltage may be relatively high. As the number of clock cycles increases (e.g., with further iterations of the programming loop), then the input voltage may be decreased. A reason for this relationship has been discussed above. The input voltage to the local charge pump may be regulated or unregulated.

In some embodiments, a determination is made as to whether to use VPP or another voltage as the input voltage. In other words, a determination may be made to use the same voltage (VPP) as input to word line drivers, bit line selection circuitry, as well as the input voltage to the local charge pumps 904. If it is determined that the input voltage should be less then VPP, then the following steps may be taken. The value for VPP1 may be established as the value of VPP that was used in the last iteration of process 600. The value for VPP is incremented such that using the value of VPP1 as the input voltage, the previously discussed inequality holds: Vdataline(peak max)<VPP+Vdiode. It is not an absolute requirement that the value of VPP1 be established as the value of VPP that is used in the previous iteration (e.g., VPP1 may take on a higher or lower value than the previous value of VPP). As previously mentioned, instead of using VPP1, an unregulated voltage such as VPP_unreg may be used. In this case, the previously discussed inequality should hold using VPP_unreg as the input voltage.

In step 654, data signals (e.g., Data(1) to Data(y)) are applied to the local charge pump 904. In step 806, the local charge pump 904 is run for the pre-determined number of clock cycles. Then, the local charge pump 904 is connected to the storage element 703 in step 808. In some embodiments, steps 806 and 808 may be reversed. In step 810, the local charge pump 904 is disconnected from the storage element 703. In step 812, the state of the storage element 703 is sensed. If the storage element 703 has been programmed to the desired state (step 814), then process 600 ends. Otherwise, process 600 continues at step 816 where the program loop count is incremented. If the program loop count is too high, then programming is aborted in step 818. Otherwise, the predetermined number of clock cycles, Npgm, is incremented in step 820. Note that it is not required that Npgm be incremented with each iteration. In some embodiments, the increment can be different for different iterations. In some embodiments, Npgm is not incremented in any iteration.

After step 820, process 600 returns to step 652 to generate the local charge pump power supply voltage and VPP. As previously discussed, the values to use for VPP and/or the input voltage may depend on Npgm.

FIG. 8A depicts one embodiment of a charge pump 702 and is one implementation of the charge pump 702 of FIG. 5A. In this example, charge pump 702 includes a global charge pump 902 and four local charge pumps 904(1)-904(4). In practice, there may be hundreds or thousands of local charge pumps 904. FIG. 8B depicts two example clock inputs CLK and CLK_ for the charge pump 702 of FIG. 8A. Each clock has an amplitude of "Vclk" volts and a period of "T." In this example, the clocks have a duty cycle of 50%, but the clocks may have a different duty cycle. The clocks are non-overlapping in some embodiments. More than two clocks may be used, as will be discussed below.

The charge pump 702 may be used to both SET and RESET memory cells. In one embodiment, each of the local charge pumps 904(1)-904(4) provides a limited charge to one Dataline (Dataline0-Dataline3 are depicted). Each local charge pump 904 inputs VPP, CLK, and one of the data signals Data_0-Data_3, which are based on the data that is to be programmed into the non-volatile storage elements associated with that Dataline. In this embodiment, there is one bit per storage element 703. Specifically, each local charge pump 904 is used to program one non-volatile storage element 703 at a given time. Note that the local charge pumps 904 are synchronized to the global charge pump 902, as a result of the common clock CLK and VPP (which is a function of CLK and CLK_). In some embodiments, both CLK and CLK_ are input to one or more of the local charge pumps 904.

The global charge pump 902 includes a number of capacitors 1202 and diodes 1204. Each capacitor 1202 is associated with one stage of the global charge pump 902 and has a capacitance "Clarge," in this example. CLK is applied to the odd stages and CLK_ is applied to the even stages. Therefore, a high voltage (Vclk) is applied to the capacitors 1202 of the even stages when a low voltage is applied to the capacitors 1204 of the odd stages, and vice versa. The size of global pump capacitors 1202 is scaled to bias the access circuitry, counter-bias the unselected storage elements and also supply the current for all local charge pumps 904. For each clock cycle, the global charge pump 902 may generate an amount of charge equal to Clarge*Vclk, where Vclk is the amplitude of each clock signal.

Each local charge pump 904(1)-904(4) includes transistor 1208, small capacitor (Csmall) 1206, diode 1210, diode 1212, transistor 1214, inverter 1215, transistor 1217, and transistor 1219. The inputs are CLK, VPP, VCC, and one of the data signals (e.g., Data_0). Note that VCC could be VDD or some other power supply. Each local charge pump 904 outputs IPP/QPP_small to a dataline. For example, local charge pump 904(1) inputs Data_0 and provides IPP/QPP_small on Dataline0.

Each local charge pump 904 is connected to VPP via transistor 1214 and diode 1212. Diode 1212 prevents charge from flowing from the local charge pump 904 back to the global charge pump 902. Transistor 1214 prevents leakage from the global charge pump 902 to the local charge pump 904. More specifically, transistor 1214 prevents leakage through forward biased diodes 1210, 1212 into Dataline0 when Dataline0=0 (i.e., when the respective bit in the data pattern should not program). Referring to local charge pump 904(1), Data0 is connected to the input of the inverter 1215, to the gate of transistor 1208, and to one terminal of transistor 1217. The output of the inverter 1215 is connected to the gate of transistor 1219. In one embodiment, when Data_0 is "1", transistor 1214 is turned on and when Data_0 is "0", transistor 1214 is turned off. For example, transistor 1214 is turned on when the non-volatile storage element 703 associated with Dataline_0 is to be programmed. In some embodiments, programming a memory cell includes either changing its state from SET to RESET or from RESET to SET. Note that even in the absence of a clock signal, were it not for transistor 1214 there might be leakage current that could cause disturb and/or accumulate over many unselected local charge pumps 904 from the global charge pump 902.

Data_0 is connected to the gate of transistor 1208 to act as a switch to cause CLK to be connected/disconnected to/from the small capacitor 1206. The amount of electric charge supplied to each storage element (and its access path) in a clock cycle is controlled by the size of local pump capacitor Csmall 1206. For each clock cycle, a given local charge pump 904 may generate an amount of charge ("QPP_small") equal to Cpp_small*Vclk, where Vclk is the amplitude of each clock signal. It may also be stated that the current output of a local charge pump ("IPP small") is equal to QPP_small/T, where T is the clock period.

Note that the charge pumps 702 in FIGS. 3 and 5A are not limited to the example implementation of FIG. 8A. For example, rather than using diodes 1204, the global charge pump 902 can have transistors that pass the charge from one stage to the next ("pass transistors"). These pass transistors may be controlled by different clocks than the main clock signals that are applied to the capacitors 1202. For example, there may be 2, 4, or 6 clock signals of period, amplitude, phase, and overlap consistent with the main clocks (applied to capacitors 1202). Also, the global charge pump 902 may have additional transistors ("control transistors") that control the switching of the pass transistors to prevent charge from moving backwards in the charge pump. The control transistors may be turned on/off by, for example, 2, 4, or 6 clock signals of period, amplitude, phase, and overlap consistent with the main clocks.

Also note that diodes 1210 and 1212 in the local charge pump 904 may be replaced by transistors, which may be controlled by one or more clocks other than the main clock that is coupled to capacitor 1206. These other clocks signals have a period, amplitude, phase, and overlap consistent with the main clock coupled to capacitor 1206. There may also be additional transistors that are used to control the switching of the transistors that replace diodes 1210 and 1212. These additional transistors may be controlled by one or more clocks with period, amplitude, phase, and overlap consistent with the main clock coupled to capacitor 1206. The additional clocks for the local charge pumps 904 may be the same additional clocks used for the global charge pump 902.

Also note that charge pumps 702, 902, 904 are not limited to positive change pumps. In some embodiments negative charge pumps are used. In one embodiment, both global 902 and local charge pumps 904 are negative charge pumps. In one embodiment, global charge pump 902 is negative and local charge pumps 904 are positive. In one embodiment, global charge pump 902 is positive and local charge pumps 904 are negative. For a negative global charge pumps, diodes 1204 are reversed compared to the example of FIG. 8A. For a negative local charge pumps diode, 1210 and 1212 are in the opposite direction as depicted in FIG. 8A. For those embodiments in which one or more of diodes 1204, 1210, 1212 are replaced with transistors, appropriate modification are made such that charge pump 902 and/or charge pumps 904 act as negative charge pumps. In some embodiments in which a negative charge pump is used, rather than coupling the local charge pump 904 to the selected bit line, the local charge pump 904 may be coupled to the selected word line (with a suitable voltage applied to the selected bit line). When running a negative charge pump for a predetermined number of clock cycles, the charge that is generated may be considered to be a negative charge. Note that providing this negative charge to the selected word line has a similar effect as providing a positive charge (from a positive charge pump) to the selected bit line.

Figure 10A:
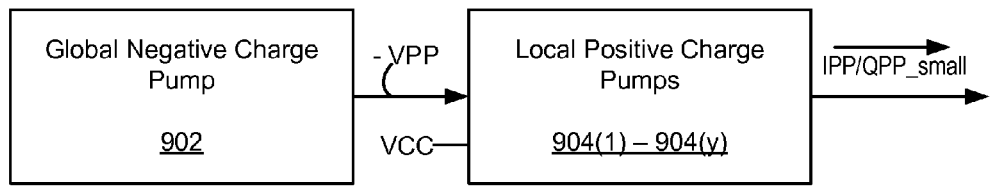
FIG. 10A depicts a block diagram of an embodiment with a negative global charge pump and positive local charge pumps.
Figure 10B:
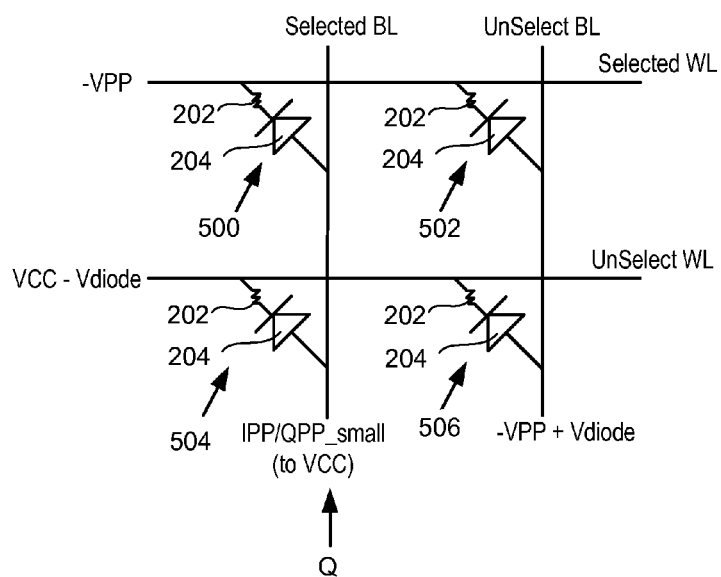
FIG. 10B depicts a schematic of voltages applied to bit lines and word lines to program a selected memory cell using the charge pumps of FIG. 10A.

FIG. 10A depicts a block diagram of an embodiment with a negative global charge pump 902 that outputs −VPP and positive local charge pumps 904. FIG. 10B depicts a schematic of voltages applied to bit lines and word lines to program a selected memory cell using the charge pumps of FIG. 10A. In this example, −VPP from the global charge pump 902 is applied to the selected word line. Each of the positive local charge pumps 904 provides a charge (Q) to the selected bit line. The unselected bit line is at −VPP+Vdiode, in this example. This voltage should avoid turning on diodes on unselected memory cells on the selected word line. A range between −VPP to −VPP+Vdiode might be used for the unselected bit line. The unselected word line is at VCC-Vdiode (where VCC is a power supply voltage). In some embodiments, IPP/QPP_small should bring the final voltage on the selected bit line to less than or equal to VCC.

Figure 11A:
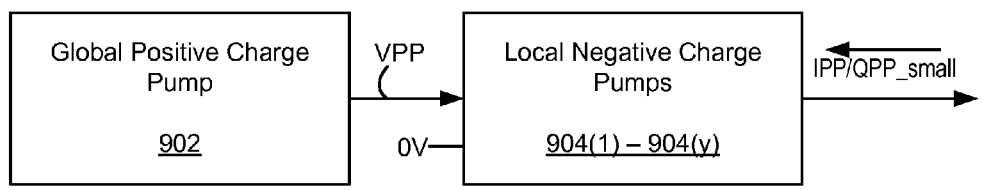
FIG. 11A depicts a block diagram of an embodiment with a positive global charge pump and negative local charge pumps.
Figure 11B:
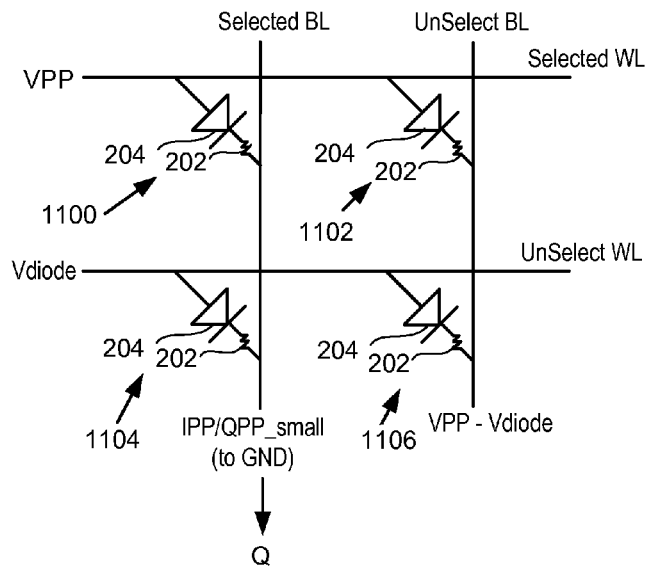
FIG. 11B depicts a schematic of voltages applied to bit lines and word lines to program a selected memory cell using the charge pumps of FIG. 11A.

In another embodiment, a positive global 902 and negative local charge pumps 904 generate negative pulses to be applied on bitlines. FIG. 11A depicts a block diagram of an embodiment with a positive global charge pump 902 and negative local charge pumps 904. FIG. 11B depicts a schematic of voltages applied to bit lines and word lines to program a selected memory cell using the charge pumps of FIG. 11A. For example, the negative local charge pumps 904 are connected to selected bit lines. However, in this case, the steering elements (e.g., diode 204) in memory cells 1100, 1102, 1104, and 1106 are connected in the opposite direction than shown in FIGS. 7 and 10B In this example, the selected word line may be at VPP, unselected word line at Vdiode, unselected bit line at VPP-Vdiode, and selected bit line is at voltage between VPP-Vdiode and ground. The negative local charge pump 904 may start at VPP-Vdiode and may then be run for a predetermined number of clock cycles to drain away a controlled amount of charge from the selected bit line, thereby causing a limited amount of charge to travel through the selected memory cell 1100. In some embodiments, IPP/QPP_small should remain greater than or equal to 0 V after IPP/QPP_small has been drained away by the local charge pump.

Figure 12A:
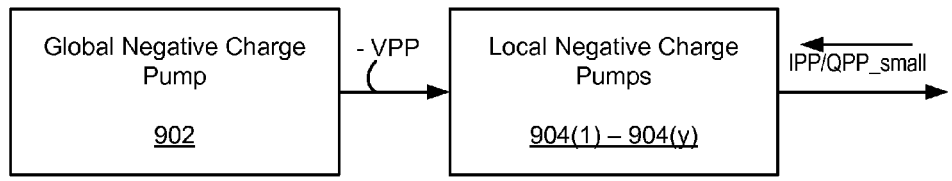
FIG. 12A depicts a block diagram of an embodiment with a negative global charge pump and negative local charge pumps.
Figure 12B:
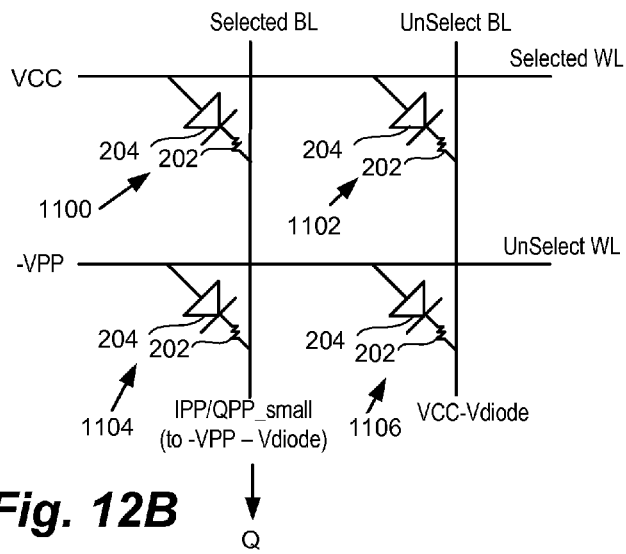
FIG. 12B depicts a schematic of voltages applied to bit lines and word lines to program a selected memory cell using the charge pumps of FIG. 12A.

In another embodiment, a negative global charge pump 902 and negative local charge pumps 904 generate negative pulses to be applied on bitlines. FIG. 12A depicts a block diagram of an embodiment with a negative global charge pump 902 that outputs −VPP and negative local charge pumps 904. FIG. 12B depicts a schematic of voltages applied to bit lines and word lines to program a selected memory cell using the charge pumps of FIG. 12A. In this example, the selected word line may be at VCC, unselected word line at −VPP, unselected bit line at VCC-Vdiode. The negative local charge pump 904 is run for a predetermined number of clock cycles to drain away a controlled amount of charge from the selected bit line, thereby causing a limited amount of charge to travel through the selected memory cell 1100. In some embodiments, IPP/QPP_small should bring the final voltage of the selected bit line to greater than or equal to −VPP-Vdiode.

Figure 13:
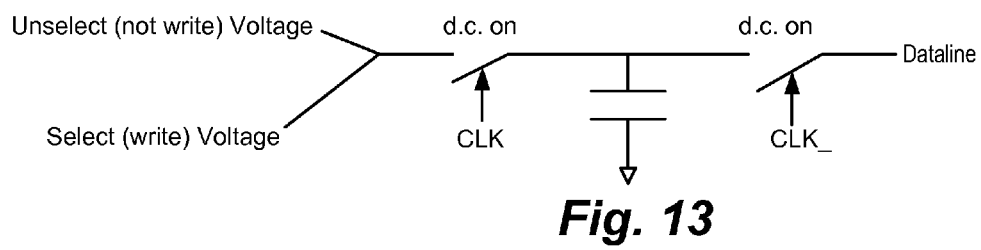
FIG. 13 depicts one embodiment of a local pump.

Note that the absolute voltages applied to the word lines and bit lines can be shifted either up or down. Also, other combinations of charge pumps may be suitable to provide a limited amount of charge to a memory cell when programming. Also note that the implementation of the local charge pumps is not required to be as complex as that depicted in FIG. 8A. For example, in some embodiments, the local charge pump is implemented as depicted in FIG. 13 (the switches may be implemented with one or more transistors). The supply voltage to local pump may switch between one value for select (bit write) condition and another value for unselect (bit not write) condition, as indicated on left side of FIG. 13. These two voltage supply values are consistent with those specified on FIGS. 10A and 11A. Correspondingly, the action of the two switches in this local pump scheme should change between d.c. on for the not write condition, and respectively alternate on/off as acted by CLK/CLK_ for the write condition. The circuit of FIG. 13 may be used for the local charge pumps 904 in embodiments that use mixed positive-negative or negative-positive charge pumps for the global and local charge pumps.

In one embodiment, the local charge pumps 904 depicted in FIG. 8A may be used to implement the local charge pumps 904 of the embodiment depicted in FIG. 5B. However, note that the global charge pump 902 depicted in FIG. 8A is not used in the embodiment depicted in FIG. 5B. As already discussed, in the embodiment of FIG. 5B, the output of the global charge pump 902 is regulated. Therefore, the global charge pump 902 is not run for a predetermined number of cycles in the embodiment of FIG. 5B.

FIG. 9A depicts one embodiment of a bit line selection circuit 1300. The bit line selection circuit 1300 is one embodiment of bit line selection 1300 connected to the local charge pumps 904(1)-904(y) in FIG. 5A or FIG. 5B. There will be one bit line selection circuit for each bit line or a set of bit line selection circuits that can be switchably connected to different subsets of bit lines.

The bit line selection circuit 1300 is connected to a Dataline to receive the signal IPP/QPP_small from a local charge pump 904. The Dataline has a capacitance 608, which is depicted in dashed lines to represent that it is a parasitic capacitance of the Dataline. The bit line selection circuit 1300 is connected to a bit line having a capacitance 604. The bit line capacitance 604 is depicted in dashed lines to represent that it is a parasitic capacitance of the bit line. In one embodiment, bit line capacitance 604 is about 1pf. Thus, the bit line is connected to a Dataline via the bit line Selection Circuit 1300.

The bit line connects to memory cell 703 that includes a reversible resistance-switching element and a diode in this embodiment. The memory cell 703 is not required to include a reversible resistance-switching element or a diode. The other end of the memory cell 703 is connected to a word line (WL). The bit line selection circuit 1300 has a switch that connects/disconnects the bit line to/from the Dataline to provide the charge IPP/QPP_small to the memory cell 703.

Each bit line may have its own bit line selection circuit 1300, and each bit line may have its own dataline. The control circuitry for the memory system sends column selection signals CSG<15:0> to the various bit line selection circuits 1300 to identify which bit lines should connect to its dataline. The large signal VPP is provided to the inverter 614 and to the Nwell of the driver (transistors 610, 612). An appropriate one of the signals CSG<15:0> is provided to the input of inverter 614 so that the output XCSEL of inverter 614 will be 0 volts when the associated bit line is selected; otherwise, XCSEL of inverter 614 will be VPP. The signal XCSEL is provided to the gates of transistors 610 and 612. When XCSEL of inverter 614 is at VPP, the unselected bit line voltage UBL of 0.7 volts (approximately one diode drop) is provided to the bit line via transistor 612. When XCSEL of inverter 614 is at 0 volts, the dataline is connected to the bit line via transistor 610. Referring to FIG. 8A, the dataline, is connected to diode 1210. Therefore, the signal IPP/QPP_small is provided to the bit line when XCSEL of inverter 614 is at 0 volts.

In some embodiments, the signal IPP/QPP_small is provided to the bit line while the charge pump clocks are running. In such an embodiment, transistor 610 should be on while the charge pump clocks are running. In some embodiments, the signal IPP/QPP_small is not provided to the bit line until the charge pump clocks have stopped running. In such an embodiment, transistor 610 should be off until the charge pump clocks have stopped running Appropriate selection signals may be provided in signal CSG<15:0> to properly control transistor 610. In some embodiments, one or more other control signal can be provided to the inverter 614 instead of VPP.

FIG. 9B depicts one embodiment of word line driver 1400. Driver 1400 is one implementation of word line driver 1400 of FIG. 5A or FIG. 5B. However, other circuitry can be used to implement the word line driver 1400. Each word line will have a driver circuit, represented by transistors 510 and 512 connected between VPP and ground. In this embodiment, the select signal is a low voltage and unselect is a high voltage. For example, by applying 0 volts to the gates of transistors 510 and 512, VPP will be driven on an unselected word line. By applying VPP to the gates of transistors 510 and 512, the selected word line will be grounded. The word line parasitic capacitance is represented by capacitor 695.

Referring back to FIG. 8A, the values for the charge pump capacitors 1202, 1206 may be selected based at least in part on parameters from the circuits of FIGS. 9A and 9B. In one embodiment in which the global charge pump is run for a predetermined number of clock cycles, the values for the large capacitors 1202 in the global charge pump 902 and the small capacitors 1206 in the local charge pumps 904 are as follows.

$$C_{small} \sim C_{DL} + C_{BL}$$

$$C_{large} \geq N_{DL} * C_{small} + N_{WL} * C_{WL} + C_{NW} + I_{leak} * T/V_{CLK}$$

In the above equations, $N_{DL}$ is the number of Datalines, $N_{WL}$ is the number of word lines, $C_{DL}$ is the capacitance 608 of an individual Dataline, $C_{BL}$ is the capacitance 604 of an individual bit line, $C_{WL}$ is the capacitance 695 of an individual word line, $C_{NW}$ is the total Nwell capacitance for all dataline/bitline drivers 610, 612, $I_{leak}$ is the leakage current all unselected diodes 204, T is the clock period, and $V_{CLK}$ is the clock amplitude. In some embodiments, the clock amplitude $V_{CLK}$ is equal to a DC voltage supply such as VCC.

As previously discussed, in some embodiments, the global charge pump 902 is controlled by a level detection circuit 907 and is not run for a predetermined number of clock cycles to generate VPP. In this case, the following condition should hold for the small capacitors in the local charge pumps 904:

$$C_{small} \sim C_{DL} + C_{BL}$$

However, it is not required that the large capacitors in the global charge pump 902 satisfy the conditions for the case in which the global charge pump 902 is run for a pre-determined number of cycles.

In some embodiments, there is a relationship between the clock period T, the capacitance of the small capacitors 1206 in the local charge pumps 904, and the resistance of the memory cell 703. For example, a condition T/C<Rcell is met, where T is the time period of clock cycles, Rcell is effective resistance of the conductive cell 703, and Csmall is the capacitance of small capacitors 1206 in the local charge pumps 904. The condition allows IPP/QPP_small to build up sufficient voltage on the selected bit lines.

In many of the circuit diagrams described above, the depicted circuits can be replaced by the dual of these circuits where NMOS and PMOS device types are exchanged, all diodes are connected in opposite directions, and positive voltages are exchanged with negative voltages. Also, as already mentioned, positive charge pumps can be replaced by negative charge pumps with other suitable adjustments. In some embodiments, the diodes 204 that serve as steering elements in the memory cells are connected in the opposite direction than is shown in FIG. 7 (see FIGS. 11B and 12B).

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An apparatus, comprising:
   a non-volatile storage element;
   a first circuit that generates charge in response to running for one or more clock cycles, the amount of the charge that is generated is a function of how many clock cycles for which the first circuit is run; and
   a second circuit that runs the first circuit for a predetermined number of clock cycles to generate an amount of charge, the second circuit provides at most the amount of charge to the non-volatile storage element to program the non-volatile storage element, the second circuit determines whether the non-volatile storage element has been programmed to a desired state as a result of providing at most the amount of charge to the non-volatile storage element.

2. The apparatus recited in claim 1, wherein the second circuit repeats the running, the providing, and the determining until the non-volatile storage element has been programmed to the desired state, the second circuit increases the predetermined number of clock cycles with each successive running, providing, and determining.

3. The apparatus of claim 2, wherein the non-volatile storage element has a low resistance state and a high resistance state, and the increase in the predetermined number of clock cycles is selected to prevent the non-volatile storage element from switching from one of the resistance states to the other resistance state and back due to providing the amount of charge that is generated by running the first circuit for the predetermined number of clock cycles.

4. The apparatus recited in claim 2, wherein the second circuit increases the predetermined number of clock cycles by 1 with each successive running, providing, and determining.

5. The apparatus recited in claim 1, wherein the predetermined number of clock cycles is selected to provide a particular amount of charge to the non-volatile storage element.

6. The apparatus recited in claim 1, wherein the second circuit connects the first circuit to the non-volatile storage element prior to beginning to run the first circuit for the predetermined number of clock cycles.

7. The apparatus recited in claim 1, wherein the second circuit connects the first circuit to the non-volatile storage element after running the first circuit for the predetermined number of clock cycles.

8. The apparatus recited in claim 1, wherein the first circuit includes a charge pump.

9. The apparatus recited in claim 1, wherein the first circuit includes a plurality of capacitors each having a capacitance "C", the non-volatile storage element has a resistance "R", and the clock signal has a period "T", and T/C is less than R.

10. The apparatus recited in claim 1, wherein the non-volatile storage element is part of one group of a plurality of groups of non-volatile storage elements, one non-volatile storage element from each group is programmed concurrently, there is a first circuit dedicated to each group.

11. A method of operating non-volatile storage, the method comprising:
running a circuit that has one or more clock inputs for a predetermined number of clock cycles, the circuit generates an amount of charge over the predetermined number of clock cycles;
providing at most the amount of charge to a non-volatile storage element to program the non-volatile storage element; and
determining whether the non-volatile storage element is programmed to a desired state as a result of providing at most the amount of charge to the non-volatile storage element.

12. The method of claim 11, further comprising:
increasing the predetermined number of clock cycles and repeating the running, the providing, and the determining until the non-volatile storage element has been programmed to the desired state.

13. The method of claim 12, wherein the non-volatile storage element has a low resistance state and a high resistance state, and the increasing the predetermined number of clock cycles includes increasing the predetermined number of clock cycles by an amount that increases the amount of charge generated by running the circuit by a sufficiently small amount that prevents the non-volatile storage element from switching from one of the resistance states to the other resistance state and back.

14. The method of claim 11, wherein the providing the amount of charge to the non-volatile storage element includes providing the amount of charge to the non-volatile storage element while running the circuit for the predetermined number of clock cycles.

15. The method of claim 11, wherein the providing the amount of charge includes:
storing the amount of charge while running the circuit for the predetermined number of clock cycles; and
providing no more than the amount of stored charge to the non-volatile storage element after running the circuit for the predetermined number of clock cycles.

16. The method as recited in claim 11, wherein the predetermined number of clock cycles is selected to deliver a particular amount of charge to the non-volatile storage element.

17. A system comprising:
a memory array including a plurality of groups of non-volatile storage elements;
a plurality of charge pumps, each of the charge pumps is associated with one of the groups of non-volatile storage elements; and
a managing circuit that runs the charge pumps for a predetermined number of clock cycles to generate an amount of energy from each of the charge pumps, the managing circuit provides no more than the amount of energy to a non-volatile storage element to be programmed from each group, the managing circuit determines whether each of the non-volatile storage elements to be programmed has been programmed to a desired state as a result of providing no more than the amount of energy.

18. The system as recited in claim 17, wherein the managing circuit repeats the running, the providing, and the determining for each of the non-volatile storage elements that is yet to be programmed to the desired state until each non-volatile storage element to be programmed has been programmed to the desired state, the managing circuit increases the predetermined number of clock cycles with each successive running, providing, and determining.

19. The system of claim 18, wherein the non-volatile storage elements have a low resistance state and a high resistance state, and the increase in the predetermined number of clock cycles is selected to prevent the non-volatile storage elements from switching from one of the resistance states to the other resistance state and back due to providing the amount of energy that is generated by running the charge pump for the predetermined number of clock cycles.

20. The system as recited in claim 17, wherein the managing circuit connects the charge pumps to the non-volatile storage elements prior to beginning to run the charge pumps.

21. The system as recited in claim 17, wherein the managing circuit connects the charge pumps to the non-volatile storage elements after running the charge pumps for the predetermined number of clock cycles.

22. The system as recited in claim 17, wherein the predetermined number of clock cycles is selected to deliver a desired amount of energy to the non-volatile storage elements.

23. The system as recited in claim 17, further including a global charge pump that provides an input voltage to each of the plurality of charge pumps, the management circuit runs the global charge pump for the predetermined number of clock cycles to generate the input voltage.

24. The system as recited in claim 17, further including:
a voltage regulator that is in communication with the one or more managing circuits; and
a global charge pump coupled to the voltage regulator and each of the plurality of charge pumps, the voltage regulator controls the global charge pump to cause the global charge pump to output a regulated voltage, the regulated voltage is input to each of the plurality of charge pumps.

25. The system of claim 24, wherein the one or more managing circuits determine a magnitude of the regulated voltage based on the predetermined number of clock cycles, the one or more managing circuits provide one or more control signals to the voltage regulator to specify the magnitude of the regulated voltage.

26. The system of claim 24, wherein the management circuit runs the plurality of charges pumps for the predetermined number of clock cycles after the regulated voltage is input to the plurality of charges pumps.

27. The system of claim 17, further comprising:
a plurality of word line drivers;
a voltage regulator that is in communication with the one or more managing circuits;
a global charge pump coupled to the voltage regulator, to the plurality of word line drivers, and to the plurality of charge pumps, the voltage regulator controls the global charge pump to cause the global charge pump to output a regulated voltage, the one or more managing circuits provide the regulated voltage to unselected word line drivers of the plurality of word line drivers, the one or more managing circuits determine whether to provide the regulated voltage to the plurality of charge pumps based on the predetermined number of clock cycles.

28. The system of claim 27, wherein if the one or more managing circuits determine that the regulated voltage should not be provided to the plurality of charge pumps, then the one or more managing circuits determine a different voltage to provide to the plurality of charge pumps, the different voltage is lower than the regulated voltage.

29. The system of claim 28, wherein the one or more managing circuits determine the different voltage based on the predetermined number of clock cycles.

30. The system of claim 29, wherein the regulated voltage is a first regulated voltage, the different voltage is a second regulated voltage, the one or more managing circuits provides one or more control signals to the voltage regulator to cause the global charge pump to generate the first regulated voltage and the second regulated voltage.

* * * * *